(12) United States Patent
Min et al.

(10) Patent No.: US 8,823,383 B2
(45) Date of Patent: Sep. 2, 2014

(54) SYSTEM AND METHOD FOR ELECTROSTATIC DISCHARGE TESTING OF DEVICES UNDER TEST

(76) Inventors: Kyung Jin Min, Campbell, CA (US); David J. Pommerenke, Rolla, MO (US); Giorgi Muchaidze, Sunnyvale, CA (US); Besarion Chikhradze, Tbilisi (GE); Iuri Kalandarishvili, Tbilisi (GE)

( * ) Notice: Subject to any disclaimer, the term of this patent is extended or adjusted under 35 U.S.C. 154(b) by 269 days.

(21) Appl. No.: 13/462,782

(22) Filed: May 2, 2012

(65) Prior Publication Data
US 2013/0002273 A1 Jan. 3, 2013

Related U.S. Application Data

(60) Provisional application No. 61/481,328, filed on May 2, 2011.

(51) Int. Cl.
*G01R 29/12* (2006.01)

(52) U.S. Cl.
USPC ........................................ 324/457; 324/73.1

(58) Field of Classification Search
USPC .................. 324/457, 458, 750.01, 71.1, 73.1
See application file for complete search history.

(56) References Cited

U.S. PATENT DOCUMENTS

2006/0085158 A1* 4/2006 Cakiner ...................... 702/121

FOREIGN PATENT DOCUMENTS

CN 101149414 A * 3/2008

* cited by examiner

*Primary Examiner* — Vincent Q Nguyen

(57) ABSTRACT

A system and method for electrostatic discharge (ESD) testing devices under test (DUTs) uses an ESD gun attached to a robotic arm to execute ESD tests. The system and method also uses cameras positioned around a DUT placed on a testing table to define at least one test point on a surface of the DUT. Using the defined test point, as well as settings on the ESD gun and a testing process scenario that includes actions to be executed by the system, the testing process is performed by the system.

20 Claims, 25 Drawing Sheets

FIG. 6

SYSTEM AND METHOD FOR ELECTROSTATIC DISCHARGE TESTING OF DEVICES UNDER TEST

CROSS REFERENCE TO RELATED APPLICATION

This application is entitled to the benefit of U.S. Provisional Patent Application Ser. No. 61/481,328, filed on May 2, 2011, which is incorporated herein by reference.

BACKGROUND OF THE INVENTION

Electronic devices, such as cellphones, may experience errors due to electrostatic discharge (ESD). ESD can cause both hard errors and soft errors in electronic devices. ESD-related hard-errors in electronic devices are errors caused by physical damage of one or more electrical components of the electronic devices, while ESD-related soft errors are errors caused by incorrect signals or data in the electronic devices. ESD-related soft errors in electronic devices include bit errors, upsets, unwanted resets, etc.

Currently, electronic devices are tested for susceptibility to ESD after the electronic devices are designed or manufactured. Conventional ESD testing involves subjecting a device under test (DUT) to ESD using a manual ESD gun, which simulates ESD from a human or other ESD sources. Using the manual ESD gun, ESD is applied to different areas of a DUT to determine whether that DUT meets predefined specifications.

This manual ESD testing is labor intensive, and it introduces testing variations due to the manual nature of the testing, which may yield inconsistent or erroneous test results.

In view of the above concerns, there is a need for a system and method for ESD testing of electronic devices that is less labor intensive and yields more reliable and/or consistent results.

SUMMARY OF THE INVENTION

A system and method for electrostatic discharge (ESD) testing devices under test (DUTs) uses an ESD gun attached to a robotic arm to execute ESD tests. The system and method also uses cameras positioned around a DUT placed on a testing table to define at least one test point on a surface of the DUT. Using the defined test point, as well as settings on the ESD gun and a testing process scenario that includes actions to be executed by the system, the testing process is performed by the system.

An ESD testing system in accordance with an embodiment of the invention comprises a testing table to accommodate the DUT, a robotic arm operably coupled to the testing table, a plurality of cameras positioned around the testing table, an ESD gun attached to the robotic arm, the ESD gun being configured to provide ESD when activated, and a control computer coupled to the robotic arm, the cameras and the ESD gun. The control computer is configured to control the robotic arm, the cameras and the ESD gun. The control computer is further configured to allow a user to define at least one test point on a surface of the DUT using images from the cameras, settings on the ESD gun and a testing process scenario that includes actions to be executed by the system during an ESD testing process. The control computer is further configured to control at least the robotic arm and the ESD gun to perform the ESD testing process using the testing process scenario, wherein the ESD testing process includes moving the ESD gun to the at least one test point using the robotic arm and activating the ESD gun at the at least one test point.

A method for ESD testing a DUT using an automated ESD testing system comprises placing the DUT on a testing table, defining at least one test point on a surface of the DUT using images from cameras positioned around the DUT placed on the testing table, defining settings on an ESD gun of the automated ESD testing system, defining a testing process scenario that includes actions to be executed by the automated ESD testing system during an ESD testing process, and performing the ESD testing process by the automated ESD testing system using the testing process scenario, wherein the ESD testing process includes moving the ESD gun to the at least one test point using a robotic arm of the automated ESD testing system and activating the ESD gun at the at least one test point.

A computer-readable storage medium containing program instructions for electrostatic discharge (ESD) testing a device under test (DUT) using an automated ESD testing system, wherein execution of the program instructions by one or more processors of a computer system causes the one or more processors to perform steps comprising defining at least one test point on a surface of the DUT using images from cameras positioned around the DUT placed on a testing table, defining settings on an ESD gun of the automated ESD testing system, defining a testing process scenario that includes actions to be executed by the automated ESD testing system during an ESD testing process, and controlling the automated ESD testing system to perform the ESD testing process using the testing process scenario, wherein the ESD testing process includes moving the ESD gun to the at least one test point using a robotic arm of the automated ESD testing system and activating the ESD gun at the at least one test point.

Other aspects and advantages of the present invention will become apparent from the following detailed description, taken in conjunction with the accompanying drawings, illustrated by way of example of the principles of the invention.

BRIEF DESCRIPTION OF THE DRAWINGS

FIG. 6 is an example of one possible implementation of a special GUI provided by a test flow execution module of the ESD testing software.

DETAILED DESCRIPTION

Figure 1:
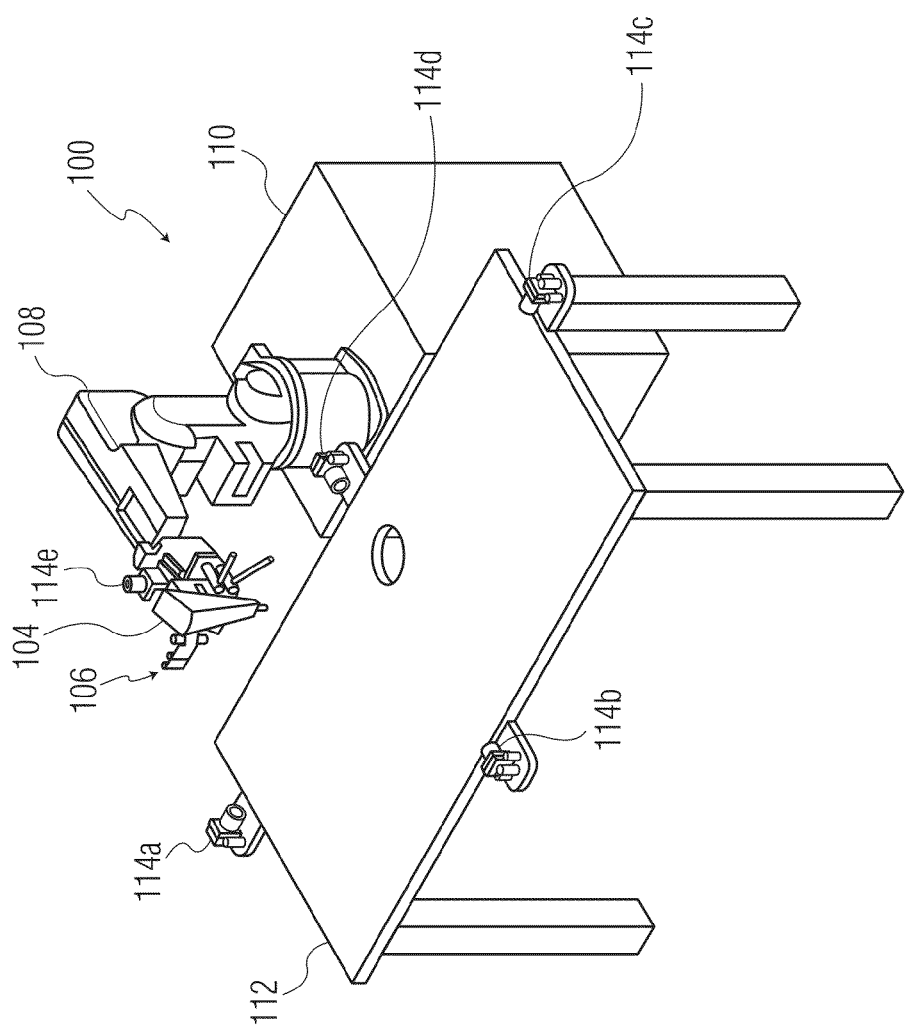
FIG. 1 is a perspective view of an electrostatic discharge (ESD) testing system in accordance with an embodiment of the invention.
Figure 2:
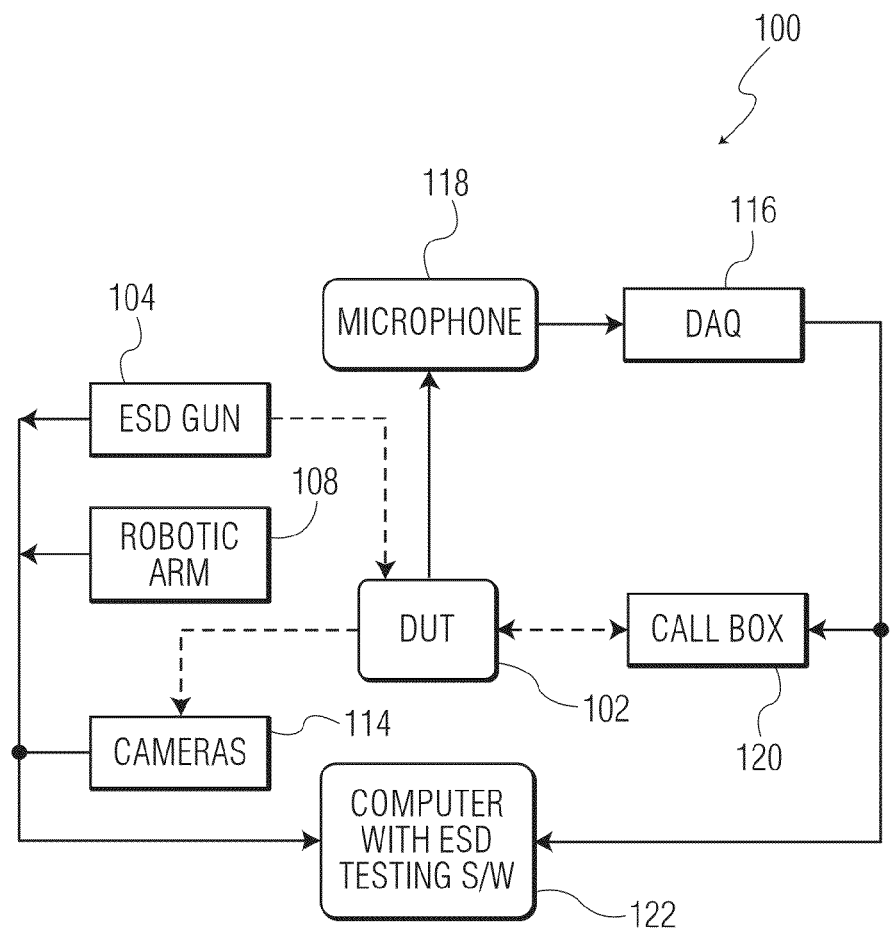
FIG. 2 is a block diagram of the ESD testing system in accordance with an embodiment of the invention.

With reference to FIGS. 1 and 2, a system 100 for ESD testing of devices under test (DUT) 102 in accordance with an embodiment of the invention is described. FIG. 1 is a perspective view of the ESD testing system. FIG. 2 is a block diagram of the ESD testing system. DUTs can be any electronic devices, such as portable electronic devices, e.g., cell phones, or electronic components. The ESD testing system is an automated robotic system for ESD testing of DUTs. The ESD testing system has automatic failure detection and report generation capabilities to execute a whole ESD test of a DUT, and thus, does not require a human operator for the actual testing. Specifically, the ESD testing system has the following main capabilities: (1) ESD testing in contact mode; (2) ESD testing in air discharge mode; (3) display failure detection; (4) acoustic failure detection; (5) call drop detection; (6) report generation; and (7) automatic DUT mode change/rebooting. In addition, the ESD testing system has the ability to define different testing scenarios, using intuitive graphic user interface (GUI), which makes the ESD testing system a universal system for identifying problematic areas in any type of DUTs As illustrated in FIGS. 1 and 2, the main components of the ESD testing system 100 includes an ESD gun 104 with controller, an instruments assembly 106 (e.g., an instruments holder, soft and hard fingers, a z height sensor, and a brush), a robotic arm 108 with controller for holding and moving the ESD gun and instruments of the instruments assembly, a robot stand 110 with metal plate, an ESD testing table 112, five cameras 114 for three-dimensional (3D) positions definition and display failure detection, a data acquisition (DAQ) module 116 with microphone 118 for acoustic failure detection, a call box 120 for call drop detection, and a control computer 122 (e.g., a PC) with an ESD testing software package.

The ESD gun 104 is a gun that generates ESD. The ESD gun is similar to manual ESD guns that are currently used for ESD testing. However, in the ESD testing system 104, the operation of the ESD gun 104 is automatically controlled and the movements of the ESD gun is performed by the robotic arm 108, which can be any type of a mechanical arm having 3D movements. The DAQ module 106 can be any device that can process analog signals. In the ESD testing system 100, the DAQ module is used to process audio signals generated by the DUT 102. In an embodiment, the audio signal from the DUT captured by the microphone 118 may be amplified and/or filtered to remove ambient noise before the signal is transmitted to the DAQ module. The amplification and filtering may be performed within the microphone or a device (not shown) connected between the microphone and the DAQ module. In an alternative embodiment, the audio signal from the DUT may be transmitted to the DAQ module without the microphone using a direct connection to the DAQ module (or an indirect connection to the DAQ module via a device for amplification and/or filtering). The call box 120 is a device that can connect to a cell phone. The call box can originate a cell phone call, disconnect an existing cell phone call and also detect when a cell phone call has been dropped. As an example, the call box may be a call box manufactured by Agilent Technologies. Some of the components of the ESD testing system are further described below.

Figure 3:
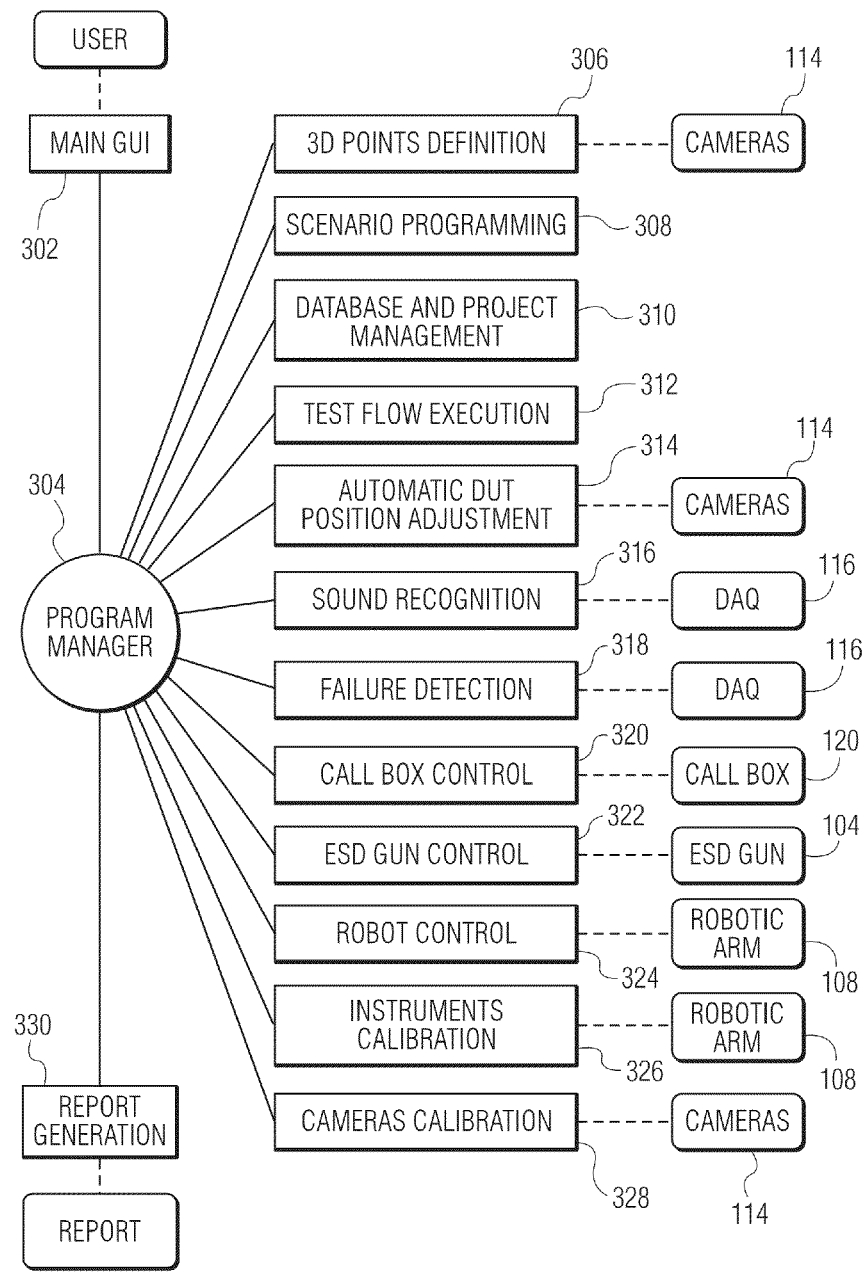
FIG. 3 is a block diagram of an ESD testing software included in a control computer of the ESD testing system in accordance with an embodiment of the invention.

As illustrated in FIG. 3, the ESD testing software used in the ESD testing system 100 includes: (1) a main GUI module 302; (2) a program manager 304; (3) a 3D space points definition module 306 (works with the cameras 114); (4) a scenario programming module 308; (5) a database and project management module 310; (6) a test flow execution module 312; (7) an automatic DUT position adjustment module 314 (works with the cameras 114); (8) sound recognition module 316 (works with the DAQ 116); (9) a failure detection module 318 (works with the cameras 114, the DAQ 116 and the call box 120); (10) a call box control module 320 (works with the call box 120); (11) an ESD gun control module 322 (works with the ESD gun 104); (12) a robot control module 324 (works with the robotic arm 108); (13) an instruments calibration module 326 (works with the robotic arm 108); (14) a cameras calibration module 328 (works with the cameras 114); and (15) a report generation module 330 (generates reports). These modules of the ESD testing software are described below. The ESD testing software may be stored in a computer-readable storage medium containing program instructions to perform operations/tasks described below with respect to the modules of the software.

The ESD testing system 100 is controlled by the ESD testing software running on the control computer 122. The ESD testing software has a user friendly GUI and allows a user to define different test cases, test scenarios, generate reports and control the overall testing process.

The main workflow process for operating the ESD testing system 100 is now described. First, the DUT 102 is place on the ESD testing table 112 and is fixed using jigs or other comparable mechanism. Then, a user defines test points on the DUT surface using the 3D positions definition module 306 of the ESD testing software and the cameras 114 of the system. Next, the user defines key positions in 3D space using the 3D positions definition module of the ESD testing software and the cameras of the system. The user then defines ESD gun settings (air or contact discharge mode, voltages, repetition, etc.). As used herein, the contact discharge mode is when the tip of the ESD gun 104, which emits ESD, is in contact with the DUT when ESD is discharged, while the air discharge mode is when the tip of the ESD gun is at a distance from the DUT when the ESD is discharged. Next, the user defines a testing process scenario, which will be followed by the ESD testing system during the testing process. A testing process scenario is a sequence of zapping (i.e., ESD discharges), key pressing, picture taking and other actions that are needed for testing process and failure detection. The user then combines together the scenario, the 3D positions, and the ESD gun settings and creates a test flow. Next, the user activates the ESD testing system for testing. According to the testing process scenario, the ESD testing system moves the ESD gun to test point positions, makes zaps, brushes, presses keys, and detects different types of failures. After the testing, the user can generate a test report in any format, such as any word processing or any spreadsheet format. The ESD testing system allows the user to save the project to file and use it in the future without redefinition of test points, scenarios, gun settings and test flow. The ESD testing system also allows most common scenarios, positions and gun settings to be saved to a database for further usage in different projects.

The program manager 304 of the ESD testing software is the main module of the ESD testing software. The program manager coordinates working of all other modules of the ESD testing software and connects them to each other.

Figure 4:
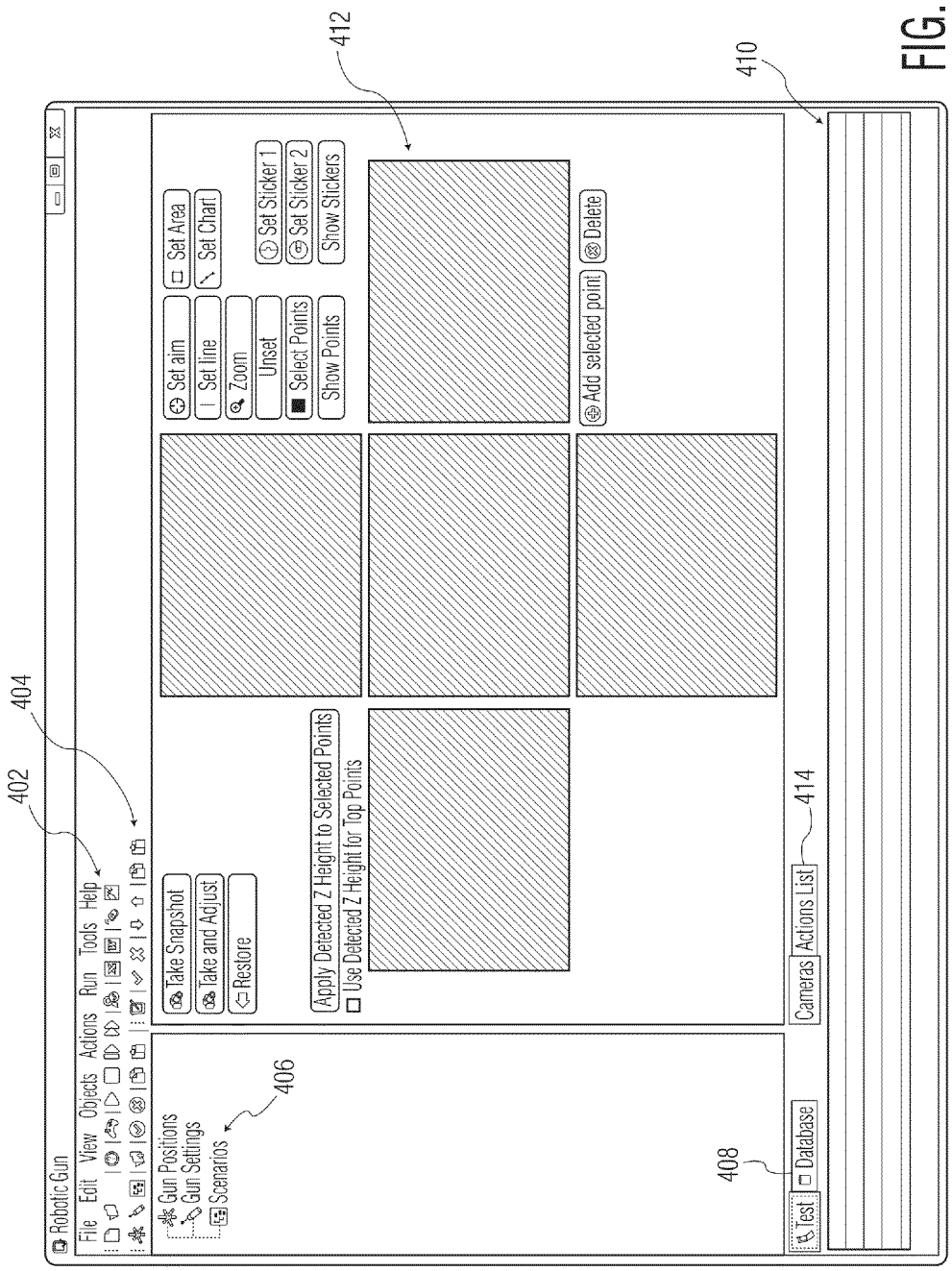
FIG. 4 is an example of one possible implementation of a main graphic user interface (GUI) provided by a main GUI module of the ESD testing software.

The main GUI module 302 of the ESD testing software provides the interface between a user and the ESD testing system 100. The main GUI module allows the user to create a test flow scenario, and execute and control the testing process using a main GUI. An example of one possible implementation of a main GUI provided by the main GUI module is shown in FIG. 4. As shown in FIG. 4, the main GUI includes a main window, which contains all other components of the GUI. The main GUI also includes a menu 402, which contains all commands that are supported in the ESD testing software, and a toolbar 404, which duplicates the most important commands of the menu. The main GUI further includes a project management tree 406, which is a tree view that is used for creating, editing, grouping and managing project components, such as positions, ESD gun settings and scenarios, and a database management tree 408, which is another tree view that is used for creating, editing, grouping and managing database components such as positions, ESD gun settings and scenarios. The main GUI also includes a message board 410, which presents messages to the user regarding current status and actions of the robotic arm 108 and the ESD gun 104. The main GUI also includes positions definition module GUI 412, which is the main area of the main window that is occupied by 3D positions definition component GUI. The positions definition module GUI contains five views from the cameras 114 and interface components working with the cameras. The GUI also includes an actions list 414, which represents the sequence of test flow scenario actions and shows current step of test flow during a testing process. The main GUI also contains different windows for robotic arm movement control, robotic arm options, robotic arm positions, ESD gun settings, other object properties, etc.

The database and project management module 310 of the ESD testing software manages robotic gun projects and one or more databases. The ESD testing software uses robotic gun project and database information, which has a hierarchical structure. Their components are created/edited/deleted and managed by the database and project management module. A robotic gun project includes objects, actions, failure detection and other information. The objects of the robotic gun project include positions, ESD gun settings, scenarios and groups. The actions of the robotic gun project include DUT test, discharge, take snapshot, key press, pause, compare images check call drop, check acoustic failure, question to user, and result generation. The failure detection initial data of the robotic gun project includes an initial image, a blackened image, a whitened image, a screen saver image and a booting screen image. Other information in the robotic gun project includes a north view image, a west view image, a south view image, an east view image, a top view image and a comparison rectangle. The different images are captured using the cameras 114, which are positioned strategically around the DUT 102. The database contains only objects part of the project. In the database, objects are stored permanently for later use in different projects. The database and project information may be saved in XML format.

Figure 5:
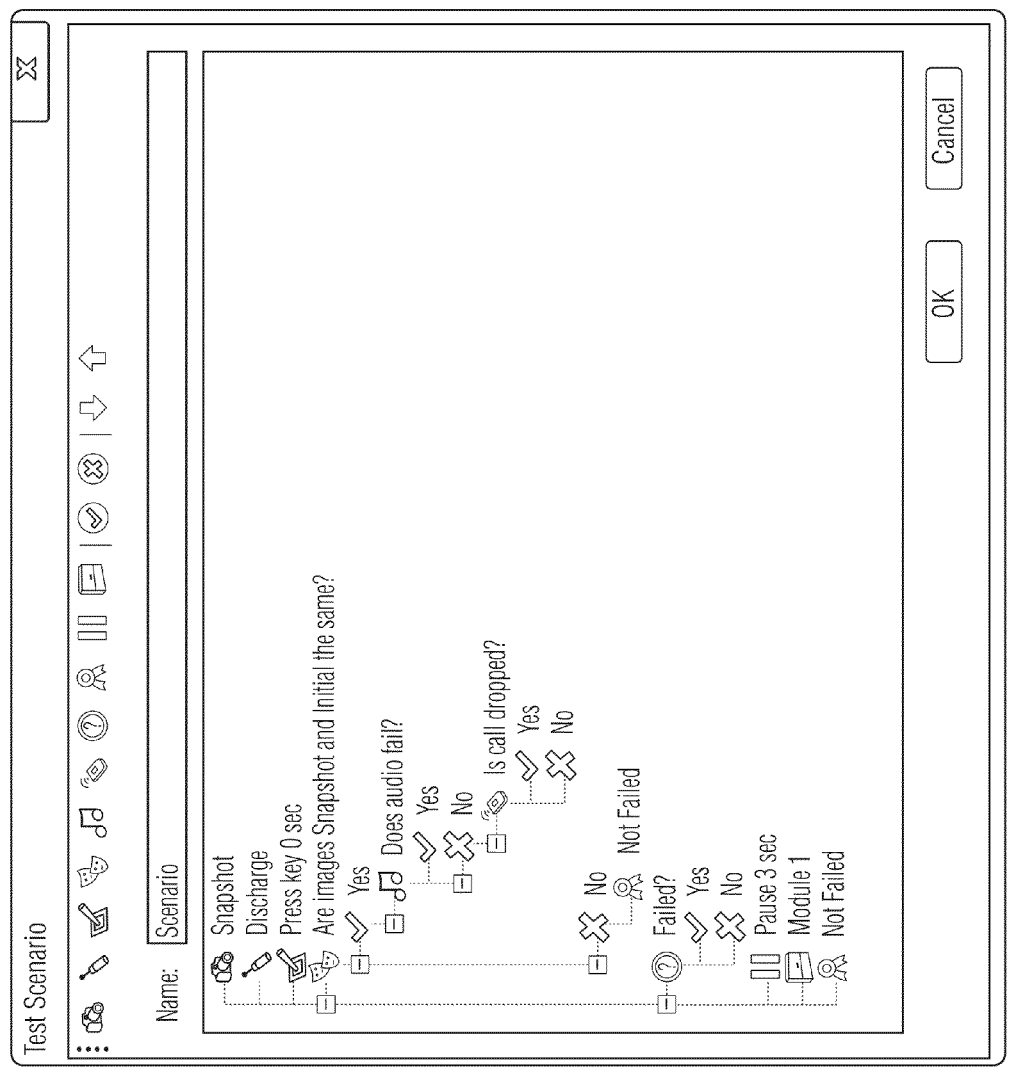
FIG. 5 is an example of one possible implementation of a special GUI provided by a scenario programming module of the ESD testing software.

The scenario programming module 308 of the ESD testing software allows a user to program different scenarios. A scenario is a testing sequence flow, which includes a sequence of different actions that are executed by the robotic arm 108 and the ESD gun 104. A scenario can contain not only sequential actions but also bifurcations according to some criteria and modules as group of actions. The scenario programming module provides a special GUI for scenario definition to allow the user to use pre-defined blocks to build customized testing flow. The parameters that be customized may include ESD gun's approach speed, discharge parameters, failure detection methods, brushing sequence, key pressing and dialing. An example of one possible implementation of a special GUI for scenario definition provided by the scenario programming module is shown in FIG. 5.

Scenarios definition gives the user a flexible way to define ESD test flows. Thus, the scenario programming module 308 provides a visual programming tool for robotic arm and ESD gun control. In an embodiment, a scenario can contain following actions:

1. Snapshot—the robotic arm 108 moves to a picture taking predefined posture and the camera 114E attached to the robotic arm takes snapshot of the DUT 102.
2. Discharge—the robotic arm 108 moves to a test point position and discharge is done by the ESD gun 104 according to predefined parameters. This action may also involve brushing. The robotic arm may approach the DUT 102 by the brush attached to the robotic arm and brushes the DUT by linear movements.
3. Press Key—the robotic arm 108 approaches a key press position by one of the fingers attached to the robotic arm and presses on the DUT (a key or a touchscreen) for a predefined time.
4. Compare Images—compares two images taken during the "snapshot" action. At this point, the test flow may split according to the comparison result.
5. Audio Fail Detection—the failure detection module 318 checks if audio failure occurred during the test. At this point, the test flow may split according to the result.

6. Call Drop—connection to the call box 120 is checked and determined whether a call was dropped or not. At this point, the test flow may split according to the result.
7. Question—a defined question is displayed to the user. At this point, the test flow may split according to the answer.
8. Result—the result can be defined that will appear in the test report. Also, DUT images can be exported to the report.
9. Pause—the ESD testing system 100 is stopped for a defined time, e.g., predefined seconds.
10. Module—a module is grouping of all other actions described above. One and the same module can be used in different places.

Besides actions, some additional parameters such as test point and key positions, gun settings are also defined separately and assigned to scenario items during test flow definition. This scenarios definition feature makes the ESD testing system 100 a universal tool for ESD testing of the electronic devices.

The test flow execution module 312 of the ESD testing software compiles and executes a test flow sequence, which is created by test point and key positions, ESD gun settings and scenarios that are merged to each other. The test flow is compiled into simple commands for hardware devices of the ESD testing system 100 (e.g., the robotic arm 108, the ESD gun 104, the DAQ module 114, etc.) and the commands are sent one by one to hardware components according to the sequence defined in the scenarios. A test sequence is not necessary linear. According to the scenario logic, bifurcations and modules are supported.

Figure 6:
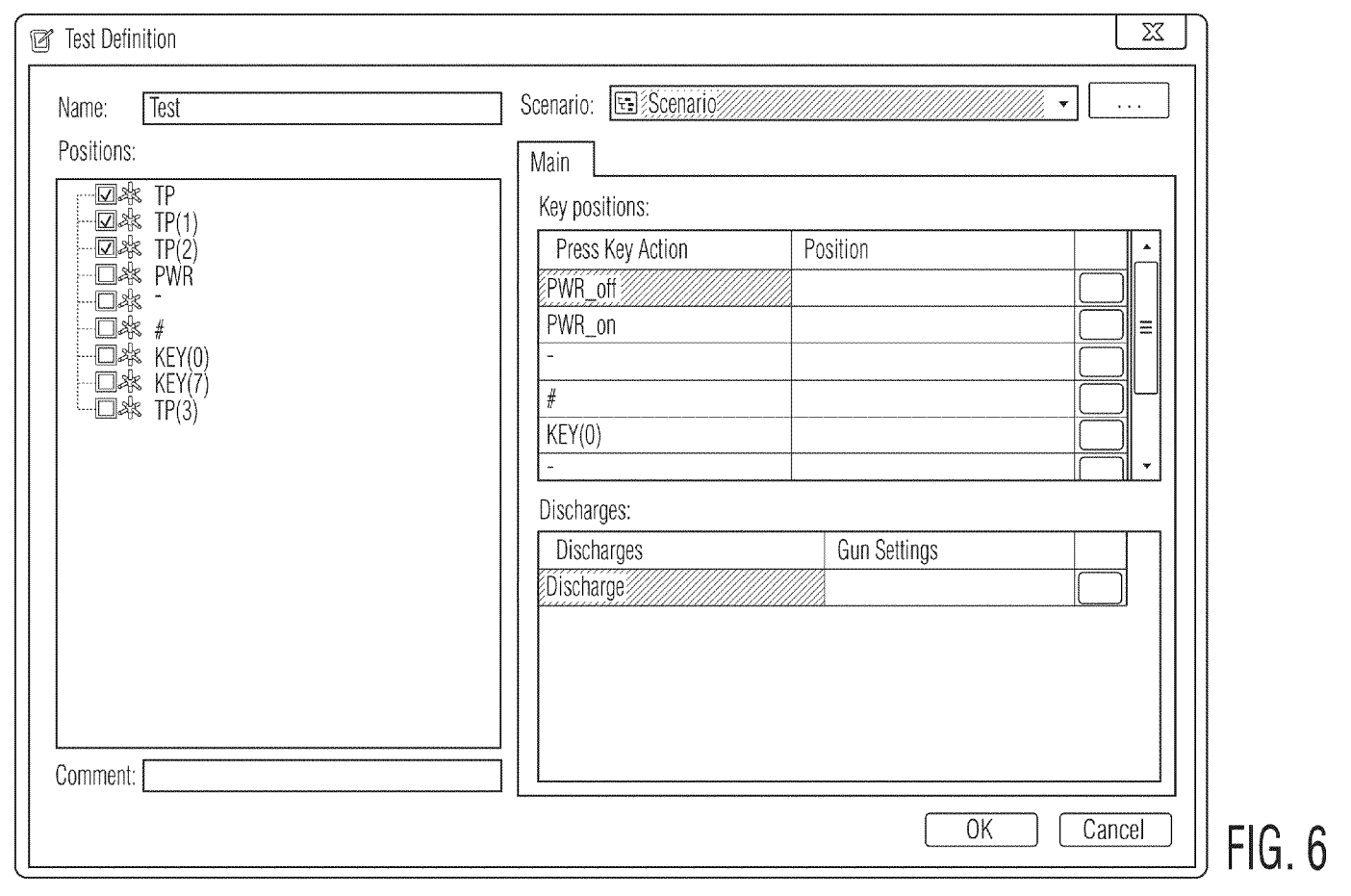

The test flow execution module 312 provides a special interface that connects together scenarios, 3D positions and ESD gun settings for test flow definition. An example of one possible implementation of a special GUI provided by the test flow execution module is shown in FIG. 6. Using the special GUI, a user selects a scenario, selects test points which should be tested using the selected scenario, assigns key press positions to key press events in the scenario, assigns gun settings to discharge events in the scenario and creates test flow. In one test project, different combinations of positions, scenarios and ESD gun settings can be mixed. This allows the ESD testing system 100 to test the same or different points with different ESD gun settings and different test scenarios. All the messages from the robotic arm 108 and the ESD gun 104 are presented to the user using a message board. Current step in a test process may be selected in the list.

The test flow steps and corresponding system actions in accordance with an embodiment are listed below:
1. Take picture—the robotic arm 108 moves the top camera 114E that is attached to the robotic arm above the DUT 102 and a picture of the DUT screen is taken.
2. Make discharge—the robotic arm 108 moves the ESD gun tip to the test point and the ESD gun is discharged. Voltage and discharge type (air or contact) is defined in the ESD gun settings.
3. Brushing—the robotic arm 108 moves to the top position, approaches the DUT 102 by the brush that is attached to the robotic arm and sweeps the whole DUT from the top above the DUT.
4. Press key—the robotic arm 108 approaches a key position by soft or hard mechanical finger that is attached to the robotic arm and presses on the DUT. The soft finger is used only for touch screens. All other buttons are pressed by the hard finger. The time duration while a key is pressed can be defined in the scenario.
5. Compare images—the ESD testing software compares two images (which images are compared is defined in the scenario) for display failure detection. After this step, the actions sequence is bifurcated and further actions sequence is chosen according to comparison result.
6. Is call dropped—the ESD testing software sends a request to the call box 120 asking whether the call is dropped or not. After this step, the actions sequence is bifurcated and further actions sequence is chosen according to the reply from the call box. If the call is dropped, a command for originating call is sent to the call box
7. Is audio failed—the ESD testing software sends a request to the failure detection module 318 asking whether analog signal monitoring thresholds were met or not. The failure detection module monitors the analog signal from the microphone 118. After this step, the actions sequence is bifurcated and further actions sequence is chosen according to the reply from the failure detection module
8. Question—question defined in the scenario is presented to the user and the system waits for his/her response. After this step, the actions sequence is bifurcated and further actions sequence is chosen according to user response. The user can add a comment or take picture of the DUT at that moment.
9. Pause—The ESD testing system stops and does nothing for a predefined duration of time.
10. Result—At this step, the result is generated and stored for later reporting. The result can be defined as failure or not. Description that is exported to the report is defined in the scenario.

It is noted here that the test process can be stopped and continued from any test point. Also retesting of failure points is supported in the ESD testing system 100.

Figure 7:
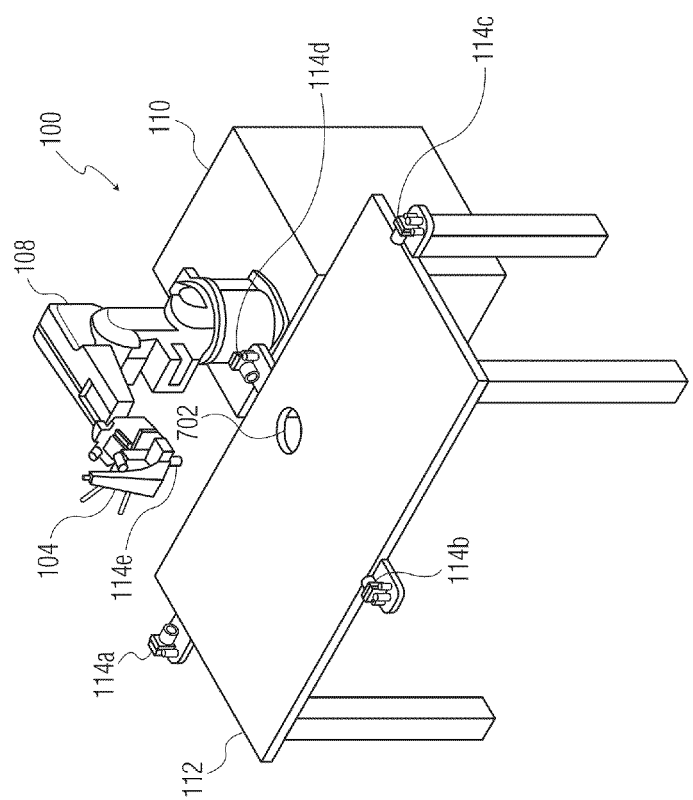
FIG. 7 is another perspective view of the ESD testing system in accordance with an embodiment of the invention.

The 3D points definition module 306 of the ESD testing software defines test points and key positions on the DUT surface using the five camera system, which includes the cameras 114. The cameras are positioned from the four sides and from the top of the DUT 102. As illustrated in FIG. 7, the cameras 114A-114D are positioned at west, south, east and north, respectively, of the DUT, which would be positioned near the hole 702 in the ESD testing table 112. The camera 114E attached to the robotic arm 108 is positioned at top of the DUT. These positions of the cameras make possible to define 3D position on any side of the DUT. For definition of the point on one side of the DUT, only two cameras are needed. For example: if a test point is located on the north side of the DUT, i.e., the side facing the north camera 114D, only the north camera 114D and one of the three cameras 114A, 114C and 114E, the west, east or top camera, is needed for its position definition. If a test point is located on the top of the DUT, then only the top camera 114E and one of the other four cameras are needed.

Figure 8:
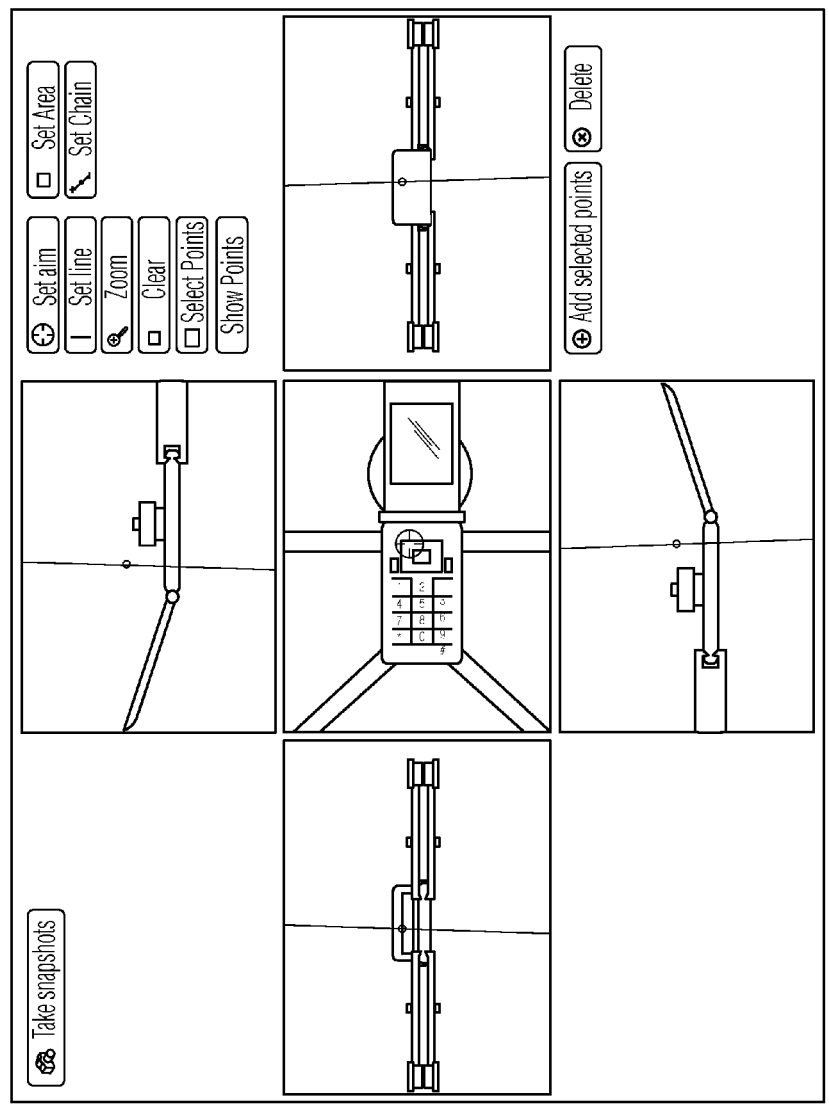
FIG. 8 is a screenshot of the main GUI, illustrating the five views of a device under test (DUT) using cameras of the ESD testing system.

In an embodiment, a 3D space position is defined using the method described below. The 3D points definition module 308 has five views of the DUT 102 from the five cameras 114A-114E, as illustrated in FIG. 8. Thus, each view shows an image from a corresponding camera. The user can reconstruct 3D space position by clicking on these views.

In order to define a 3D space position or point using the cameras 114, the user takes snapshots using the ESD testing software from all five cameras. The user then defines a target point on one camera view picture on the surface of the DUT and defines the surface plane level in the second camera view picture, where the surface plane level is perpendicular to the selected surface of the DUT. The ESD testing software gets target coordinates (u, v) from one camera view picture and u or v level value from another camera view picture. These two view pictures are from two cameras that are pointing in perpendicular directions to the DUT. Using these three values, the 3D points definition module 306 reconstructs the 3D position in the space on the DUT surface.

Figure 9:
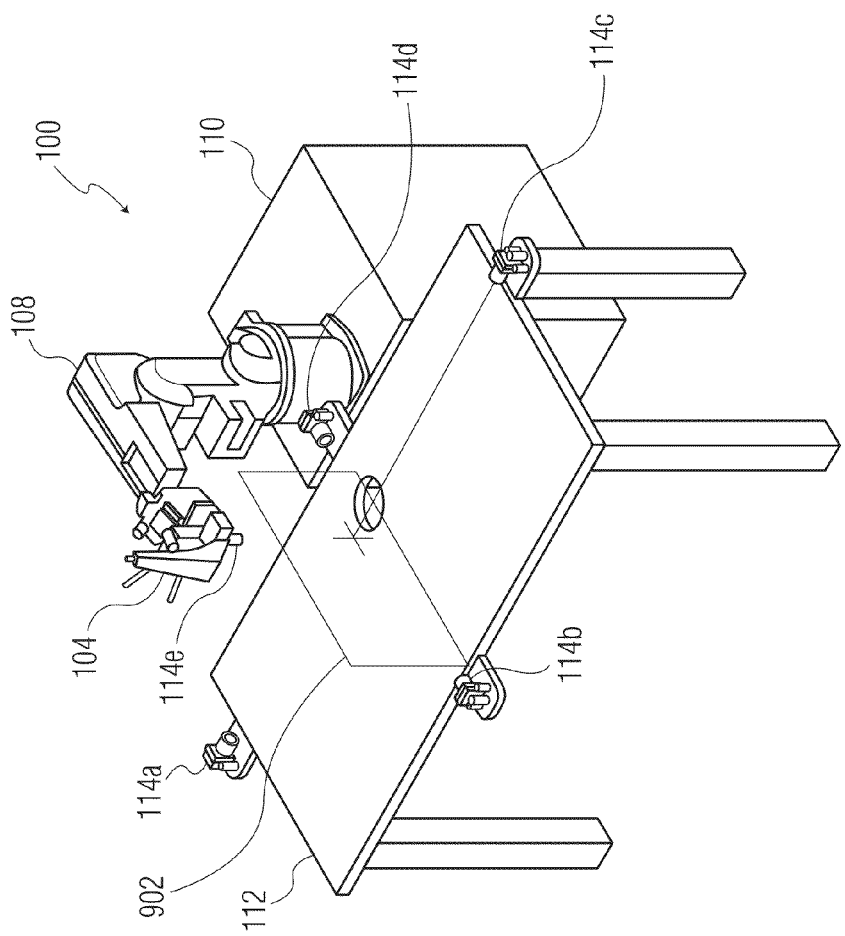
FIG. 9 is another perspective view of the ESD testing system in accordance with an embodiment of the invention, illustrating a plane and a point on the plane determined using two cameras, which are pointing in perpendicular directions with each other, to define a 3D space position or point.
Figure 10A:
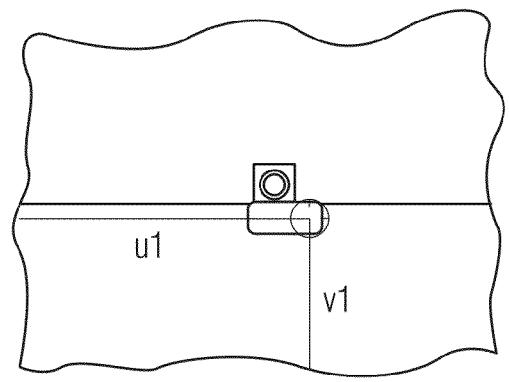
FIGS. 10A and 10B show two views from the two cameras to determine the plane and the point on the plane illustrated in FIG. 9.
Figure 10B:
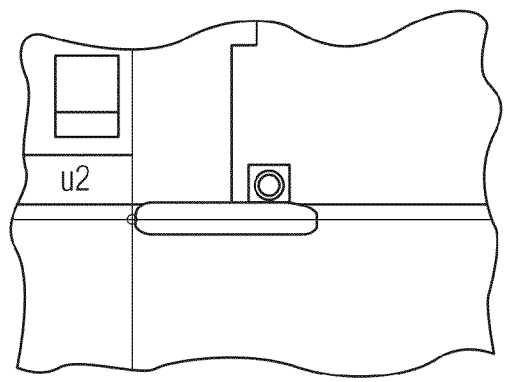

The 3D position is reconstructed as follows. Let's consider that (u1,v1) target position from one view, for example, the east view from the camera 114C, as illustrated in FIGS. 9 and 10A, and u2 vertical plane level value is given from another view, for example, the south view from the camera 114B, as illustrated in FIGS. 9 and 10B, and M1 and M2 are corresponding cameras' calibration matrices. In FIG. 9, the target position (u1, v1) is illustrated as a "+" on a plane 902, which corresponds to the u2 vertical plane level. The calibration matrices are calculated during a calibration process described below with respect to the cameras calibration module 328. Then, (x,y,z) coordinates of the point in the space are calculated following way:

$$\begin{bmatrix} x \\ y \\ z \end{bmatrix} = (A' * A)_{inv} * A' * B$$

where $$A = \begin{bmatrix} M1[1,1] - M1[3,1]*u_1 & M1[1,2] - M1[3,2]*u_1 & M1[1,3] - M1[3,3]*u_1 \\ M1[2,1] - M1[3,1]*v_1 & M1[2,2] - M1[3,2]*v_1 & M1[2,3] - M1[3,3]*v_1 \\ M2[1,1] - M2[3,1]*u_2 & M2[1,2] - M2[3,2]*u_2 & M2[1,3] - M2[3,3]*u_2 \end{bmatrix}$$

$$B = \begin{bmatrix} u_1 - M1[1,4] \\ v_1 - M1[2,4] \\ u_2 - M2[1,4] \end{bmatrix}.$$

Figure 11:
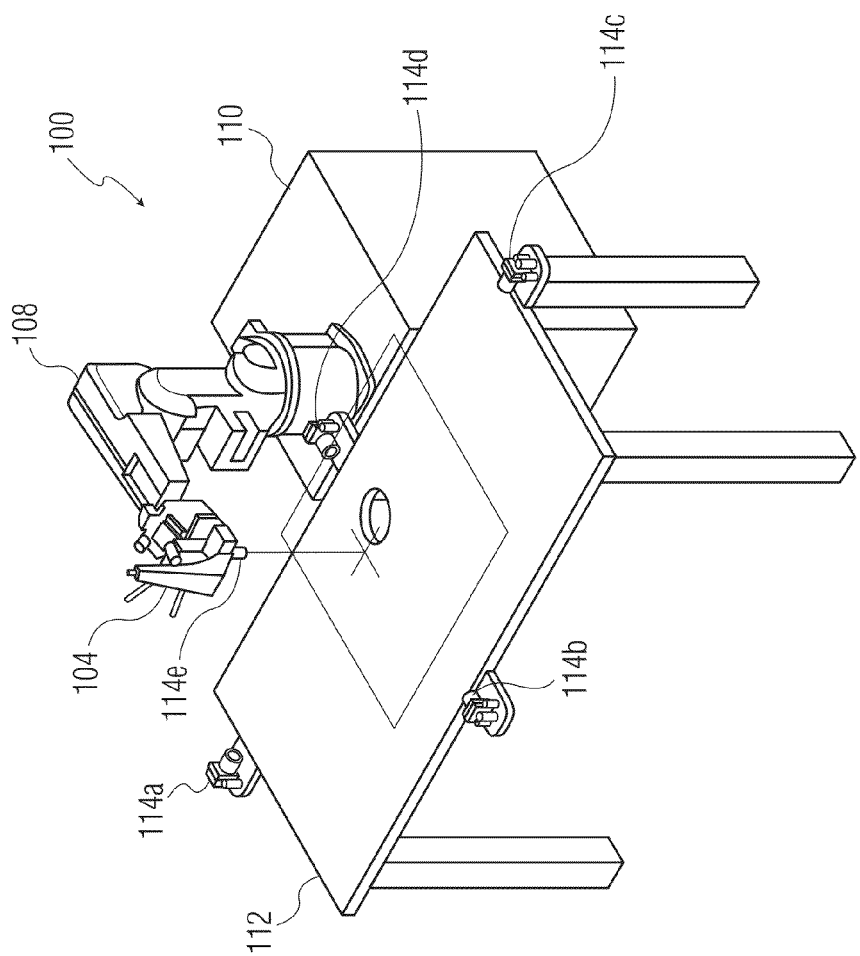
FIG. 11 is another perspective view of the ESD testing system in accordance with an embodiment of the invention, illustrating the use of a z-height sensor to determine the z height of a DUT.
Figure 12A:
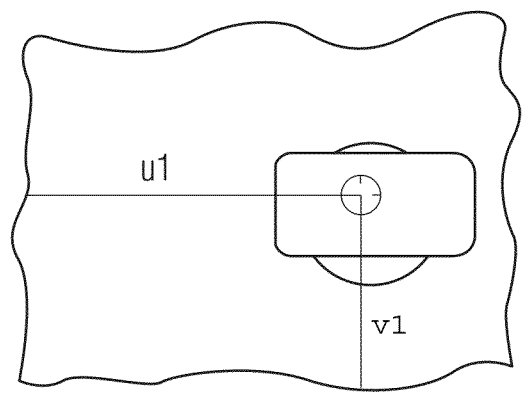
FIGS. 12A and 12B shows two views from two cameras to determine a point on the top surface of a DUT.
Figure 12B:
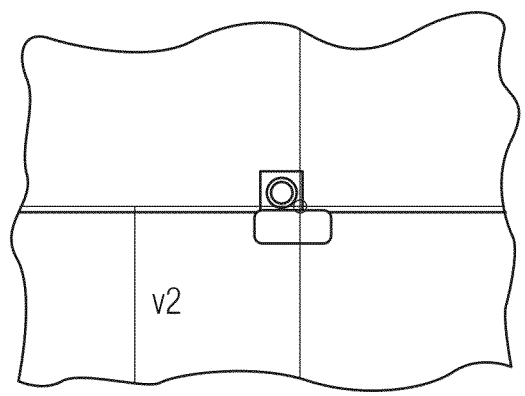

If (u1,v1) is the target position from one view, for example, the top view from the camera 114E, as illustrated in FIGS. 11 and 12A, and v2 horizontal plane level value from another view, for example, the east view from the camera 114C, as illustrated in FIGS. 11 and 12B, and M1 and M2 are corresponding cameras' calibration matrices, then A and B matrices are following:

$$A = \begin{bmatrix} M1[1,1] - M1[3,1]*u_1 & M1[1,2] - M1[3,2]*u_1 & M1[1,3] - M1[3,3]*u_1 \\ M1[2,1] - M1[3,1]*v_1 & M1[2,2] - M1[3,2]*v_1 & M1[2,3] - M1[3,3]*v_1 \\ M2[2,1] - M2[3,2]*v_2 & M2[2,2] - M2[3,2]*v_2 & M2[2,3] - M2[3,3]*v_2 \end{bmatrix}$$

$$B = \begin{bmatrix} u_1 - M1[1,4] \\ v_1 - M1[2,4] \\ v_2 - M2[2,4] \end{bmatrix}$$

For more comfortable usage of this functionality, as soon as the target position is defined, corresponding view lines from other camera centers to the target point are drawn on the camera view pictures. Several points in line or on grid can be defined at once.

Additionally, the user can determine the z height of the DUT surface by the z height sensor attached to the robotic arm 108. In order to determine the z height of the DUT surface, the robotic arm moves above the DUT 102 and approaches it vertically from the top by the z height sensor. As soon as the z height sensor touches the DUT surface, signal from the z height sensor is changed and the ESD testing software determines the position of the tip of the z height sensor. Thus, in this embodiment, the z height sensor is a touch sensitive sensor. The z height (i.e., the distance from the top surface of the ESD testing table 112) of the sensor tip is the height of the DUT. This value can be assigned automatically to the test points or key positions defined on the top surface of the DUT.

The cameras calibration module 328 of the ESD testing software calibrates the cameras 114 of the ESD testing system 100. In order to reconstruct a 3D position from two camera views, the cameras should be calibrated. Projection matrix that projects a 3D space point on a 2D plane of the camera image needs to be known. For calibration of the matrix, six pairs of (x, y, z) position in 3D space and its corresponding (u, v) coordinates in the camera view should be known. The following equations show how (x, y, z) 3D point is projected (u, v) on the plane using the projection matrix m.

$$(m11-um31)x+(m12-um32)y+(m13-um33)z+m14=u$$

$$(m21-vm31)x+(m22-vm32)y+(m23-vm33)z+m24=v$$

The above equations are described in "*Robust Camera Calibration using 2D to 3D Feature Correspondences*," by Fadi Dornaika and Christophe Garcia, Institute For System Design Technology, GMD—German National Research Center for Information Technology, Schloss Birlinghoven, 53754 Sankt Augustin, GERMANY.

If one considers that x, y, z, u and v are known and matrix elements are unknown, one can calculate them by having six pairs of such equations. If one writes the equations in matrix form, one gets the following. Camera projection matrix M[3, 4] has 3×4 dimensions and is calculated as:

$$M = (A' * A)_{inv} * A' * B$$

where

-continued $$A = \begin{bmatrix} x_k & 0 & -x_k u_k & y_k & 0 & -y_k u_k & z_k & 0 & -z_k u_k & 1 & 0 \\ 0 & x_k & -x_k v_k & 0 & y_k & -y_k v_k & 0 & z_k & -z_k v_k & 0 & 1 \\ \ldots & \ldots & \ldots & \ldots & \ldots & \ldots & \ldots & \ldots & \ldots & \ldots & \ldots \end{bmatrix}$$

$$B = \begin{bmatrix} u_k \\ v_k \\ \ldots \end{bmatrix}$$

$$k = [1, \ldots, 6]$$

Figure 13:
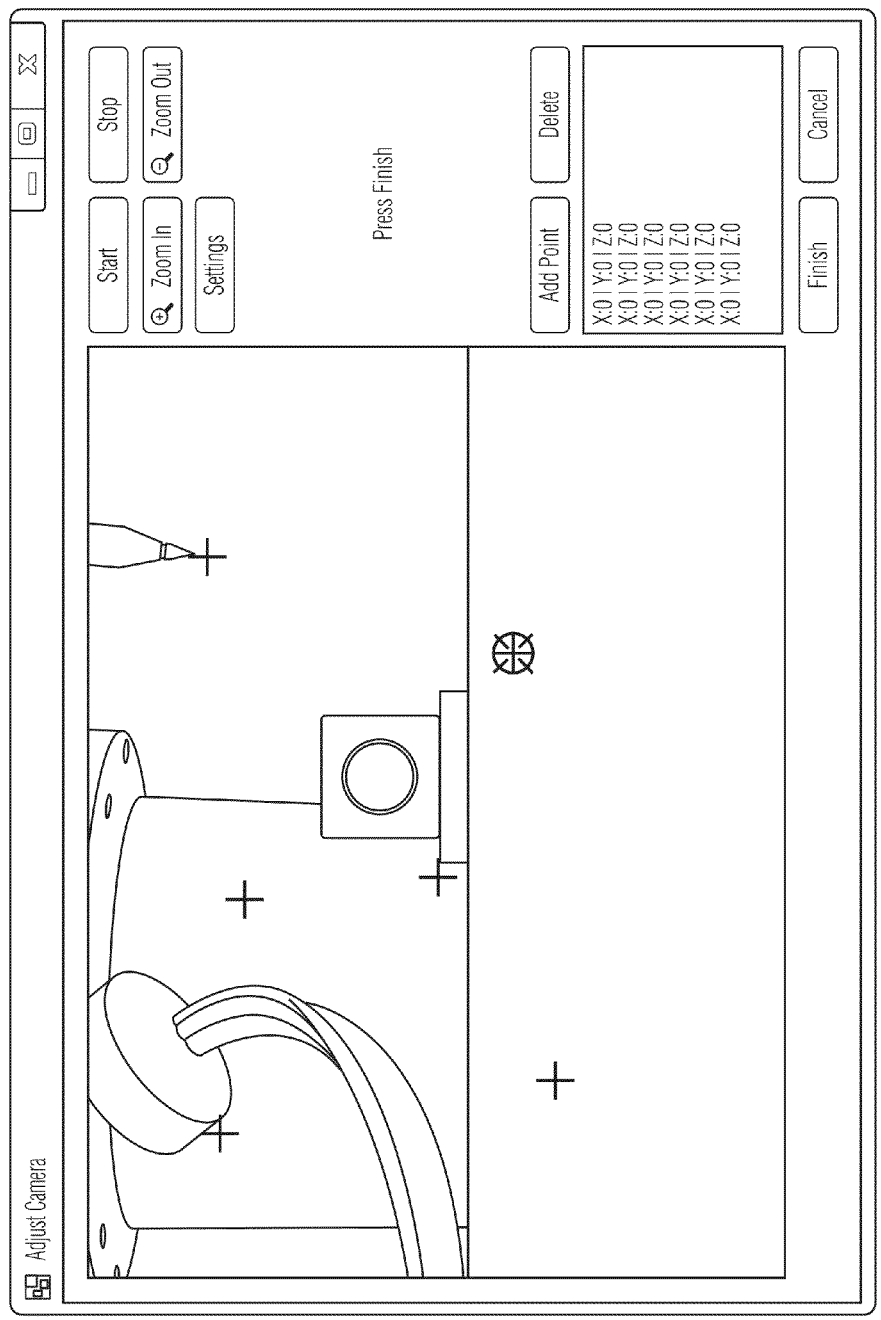
FIG. 13 is an example of one possible implementation of a special GUI provided by a cameras calibration module of the ESD testing software.

The cameras calibration module 328 provides a special GUI for cameras calibration. Using this GUI, a user can move the robotic arm to six predefined positions and click on the ESD gun tip on the camera view live image, as illustrated in FIG. 13, which is an example of one possible implementation of a special GUI provided by the cameras calibration module. In this way, six points in 3D space from gun tip coordinates and their corresponding six positions in camera view image can be acquired.

For each camera calibration, six 3D positions with corresponding 2D projections are needed. But, one can use the same 3D positions (2D projections will be still different) for all cameras except the top one.

The robot control module 324 of the ESD testing software controls the robotic arm 108. In an embodiment, the robotic arm is a robotic arm model Melfa RV-35 DBS manufactured by Mitsubishi. However, any robotic arm that have similar movement capabilities can be used in the ESD testing system 100. As described above, the robotic arm is used for moving the ESD gun 104 to test points, pressing keys, brushing and z height sensing. The robotic arm is also used in cameras and instruments calibration processes. In an embodiment, the robot control module may use a local area network (LAN) interface is used for interaction with the robot controller, which is part of the robotic arm.

Figure 14:
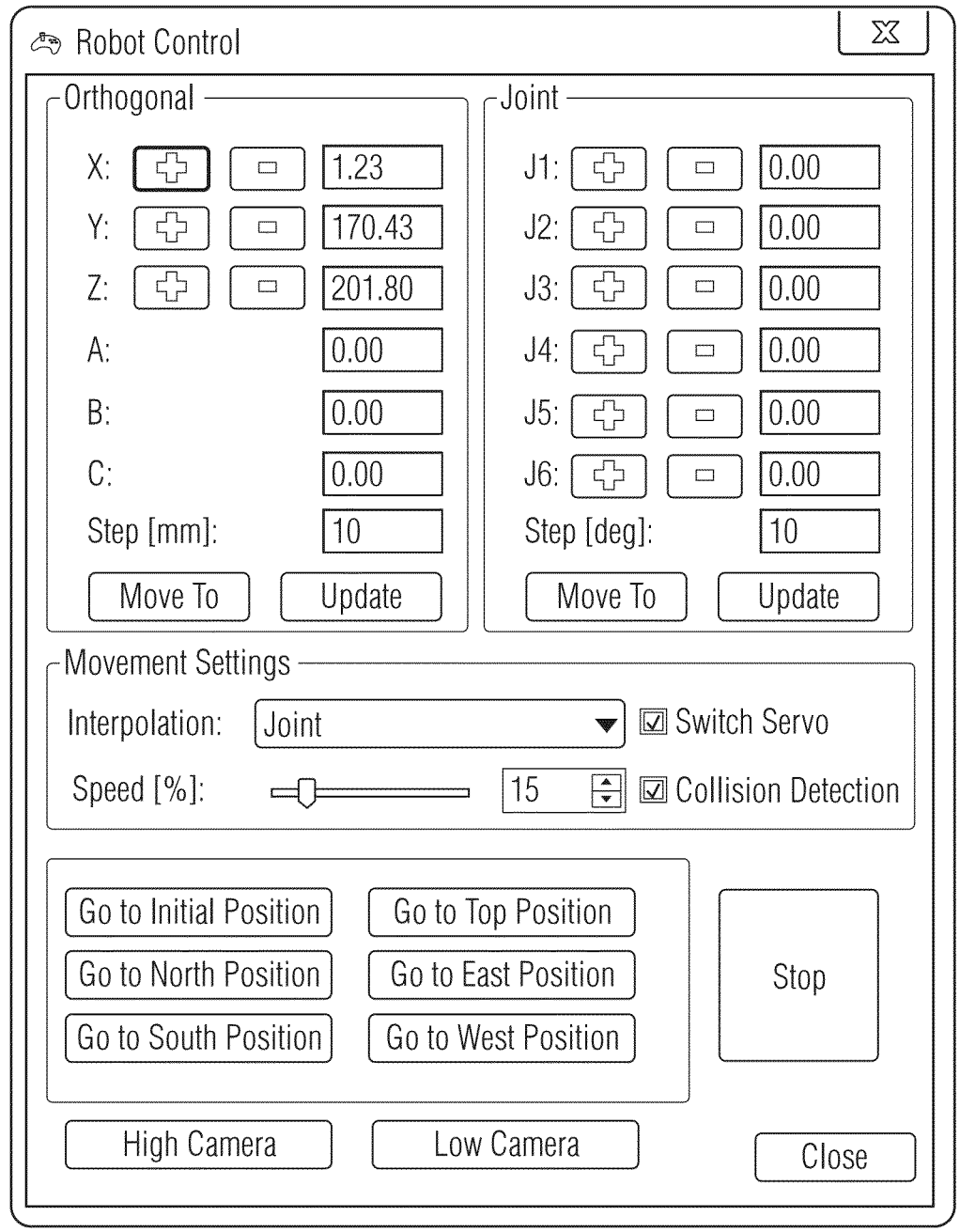
FIG. 14 is an example of one possible implementation of a special GUI provided by a robot control module of the ESD testing software.

The robot control module 324 provides a special GUI for manual manipulation of the robotic arm 108. In addition, the robotic arm may also be manually controlled using a joystick (not shown) or other control device. An example of one possible implementation of a special GUI for manual control of the robotic arm provided by the robot control module is shown in FIG. 14.

The robotic arm 108 can be moved either by defining angles of each of the six junctions or by linear movement of the robot tip maintaining the posture of the selected instrument that is attached to the robotic arm. Junctions are the joints of the robotic arm and the posture is the angle of the instrument in the coordinates system of the robotic arm. Posture is defined by three values (A, B, C): A-rotation around X axis, B-rotation around Y axis and C-rotation around Z axis.

The second method has a singularity issue in that sometimes the robotic arm 108 cannot make linear movement from point A to point B maintaining the same posture. This issue causes problems for reaching the DUT 102 from all sides.

Figure 15A:
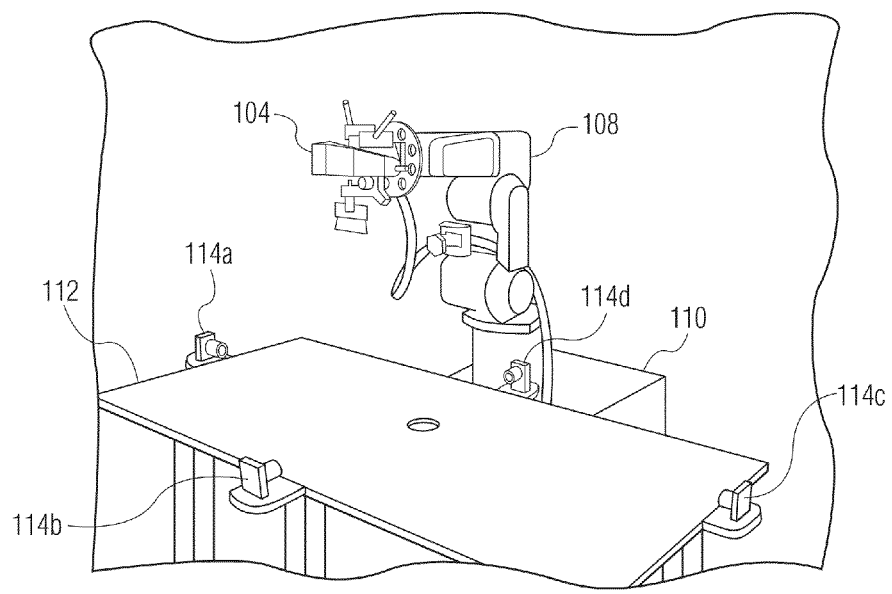
FIGS. 15A-15J are perspective views of a robotic arm of the ESD testing system at different standard positions in accordance with an embodiment of the invention.
Figure 15B:
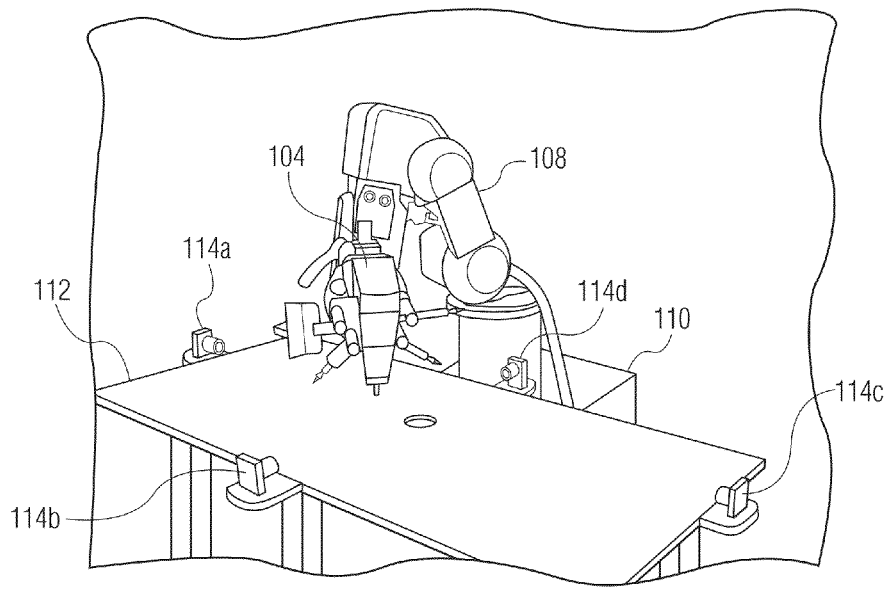
Figure 15C:
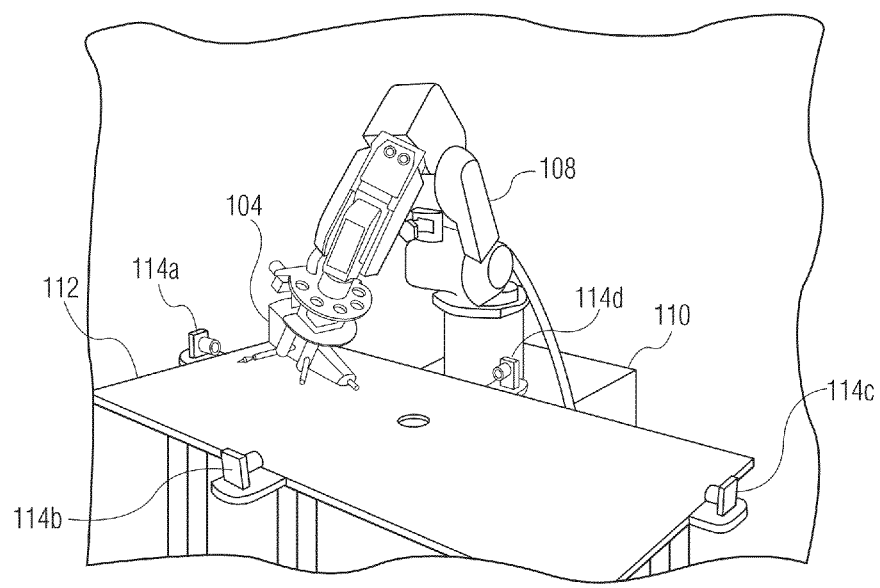
Figure 15D:
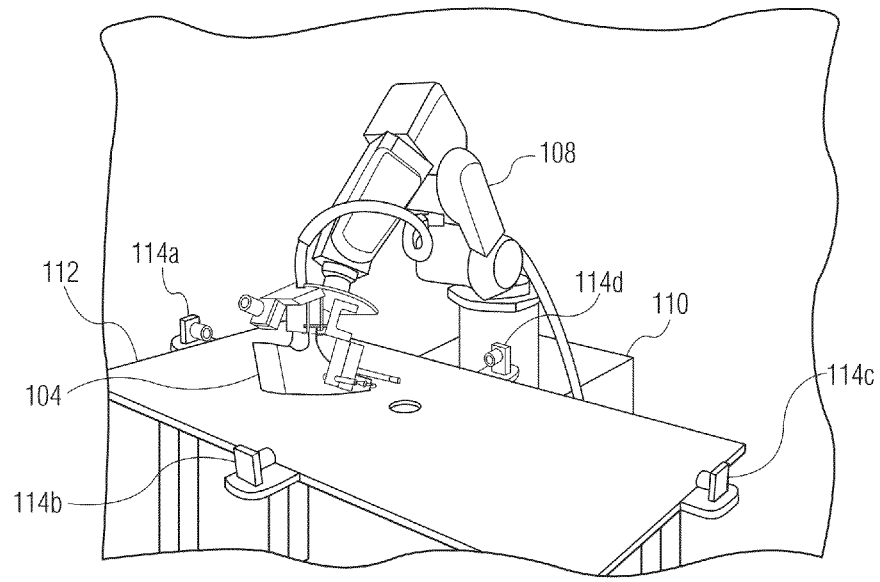
Figure 15E:
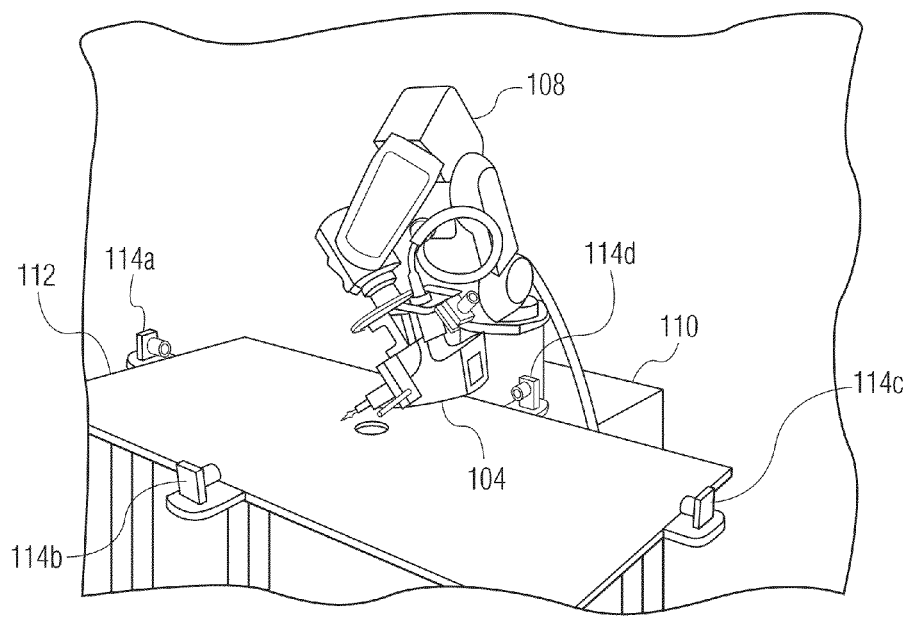
Figure 15F:
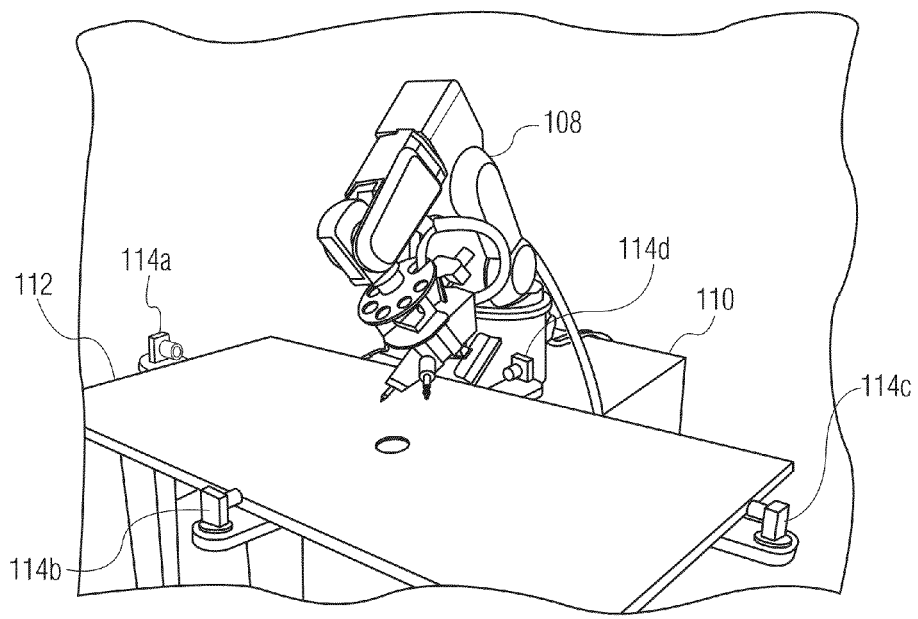
Figure 16A:
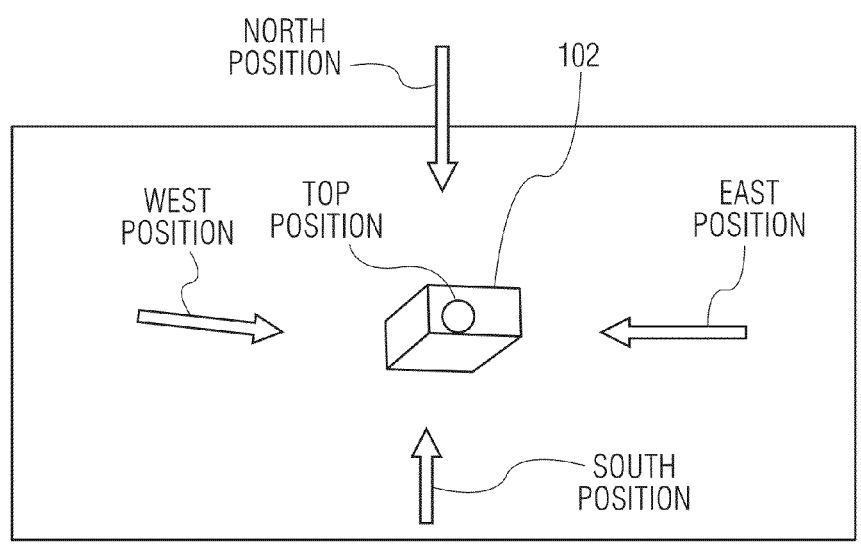
FIGS. 16A and 16B are diagrams that illustrate some of the different standard positions of the robotic arm shown in FIGS. 15A-15J.
Figure 16B:
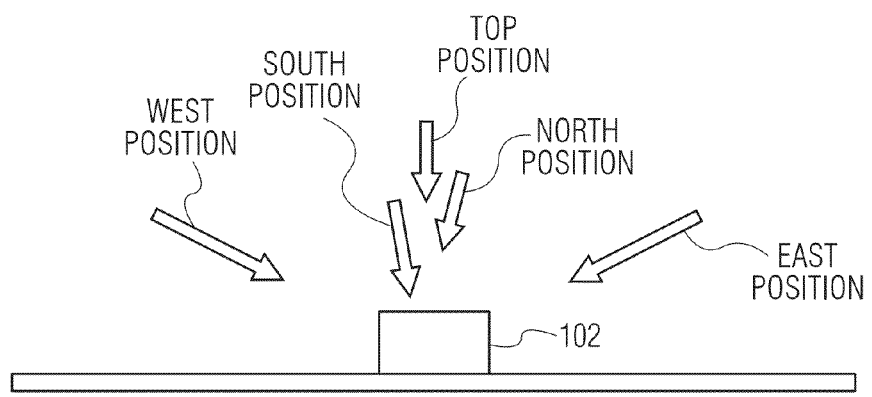

To overcome the issue, standard positions are introduced in the ESD testing system 100 for the robotic arm 108. These standard positions are optimal postures for each side of the DUT 102. There are five main standard positions (one for each side): the north standard position (shown in FIG. 15F), the east standard position (shown in FIG. 15E), the south standard position (shown in FIG. 15D), the west standard position (shown in FIG. 15C) and the top standard position (shown in FIG. 15B). These five positions are also illustrated in FIGS. 16A and 16B. These positions are represented in angles of joints [J1, J2, J3, J4, J5, J6] and are:

1. North: 15.27, 31.55, 109.05, 15.41, 72.87, 106.54
2. West: −0.54, 26.46, 115.12, −46.92, 41.98, 33.02
3. South: 6.8, 44.38, 88.9, 19.35, 14.2, 261.93
4. East: 18.33, 40.29, 92.67, 46.56, 52.13, 161.22
5. Top: −18.43, 13.85, 146.2, −76.67, −80.75, −64.66

Every point on the DUT surface can be reached by linear movement from its side's corresponding standard position without the singularity issue. There is also one base standard position called "initial position" (shown in FIG. 15A). Movement of the robotic arm 108 from one standard position to another is always made through the initial position. This is necessary to not hit or contact the DUT 102 during the robotic arm movement. For example, if the robotic arm is to move from the north standard position to the south standard position, the robotic arm moves from the north standard position to the initial position and then from the initial position to the south standard position, which can be denoted as North→Initial→South.

The initial standard position of the robotic arm 108 has been chosen so that the robotic arm can move to this position from every point without singularity and hitting the DUT 102, and the robotic arm can move from this position to any other standard position without singularity and hitting the DUT. The robotic arm does not need to return to the initial position when it finishes moving.

The singularity issue may be resolved if the problematic posture is avoided. However, there are two problems: 1) it is not known whether the robotic arm 108 can move or not from point "a" to point "b" until the robotic arm actually gets stuck during the movement process; and 2) even if it is known that the robotic arm would get stuck, one would not know how to change the posture to overcome singularity issue.

The use of standard positions solves these problems. This is because every point on the DUT 102 can be reached from its side's corresponding standard position without problem (for example, if point is located on the south side of the DUT, it can be reached from the south standard position without any problem). Thus, the first problem mentioned above is solved. Also, the robotic arm 108 can move to the initial position from any current position without singularity issue and hitting the DUT. Thus, the second problem mentioned above is solved.

According to this solution, if the robotic arm 108 is in position "a" and wants to move to position "b" that is located at the south side of the DUT, the robotic arm is first moved to the initial position, then moved to the south standard position and then moved to point "b".

Movements of the robotic arm 108 between standard positions are done by junctions' angle changing method and use the initial position to remove the singularity issues. The movement of the robotic arm from one position to another is made through the initial position, but movement itself is made by directly setting the rotation angles of each junction of the robot arm. The robotic arm supports two methods of arm movement: 1) linear (in this case, coordinates and rotation angles of robot arm tip is defined); and 2) junction (in this case angle of each junction of the robotic arm is defined). For example, if the robotic arm is in the south position and one wants to move the robotic arm to the north position, the robotic arm junction angles are set that correspond to the initial position (this causes movement of the robotic arm to the initial position) and then set values that correspond to the north position.

Figure 15G:
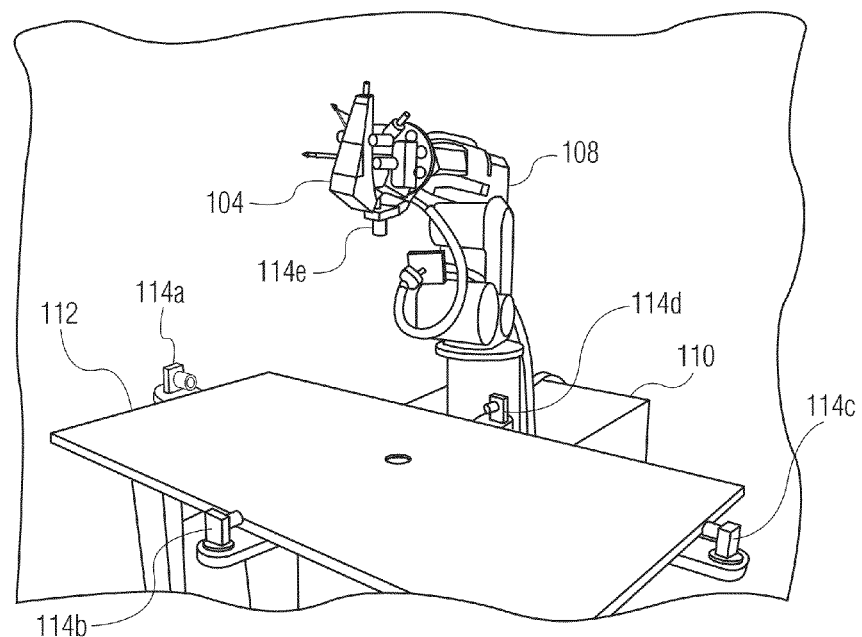
Figure 15H:
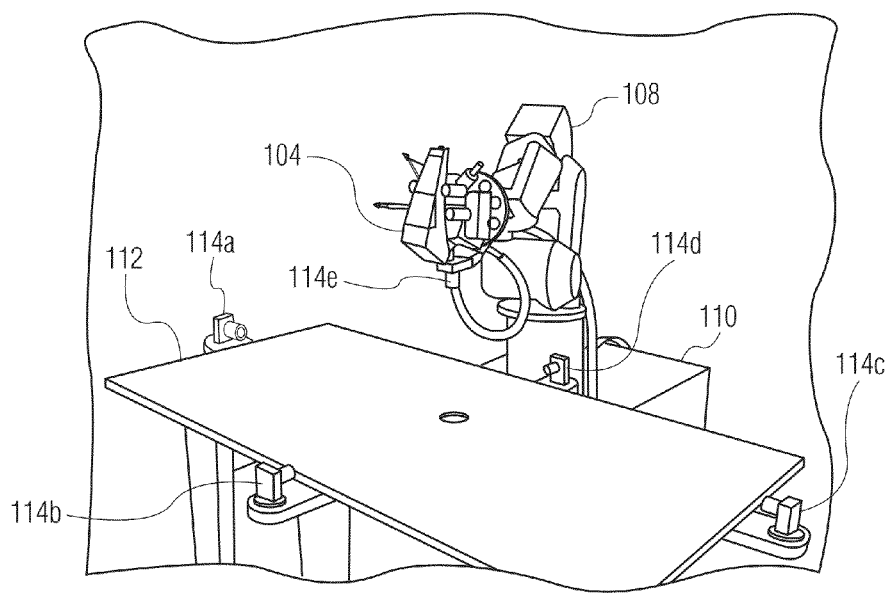
Figure 15I:
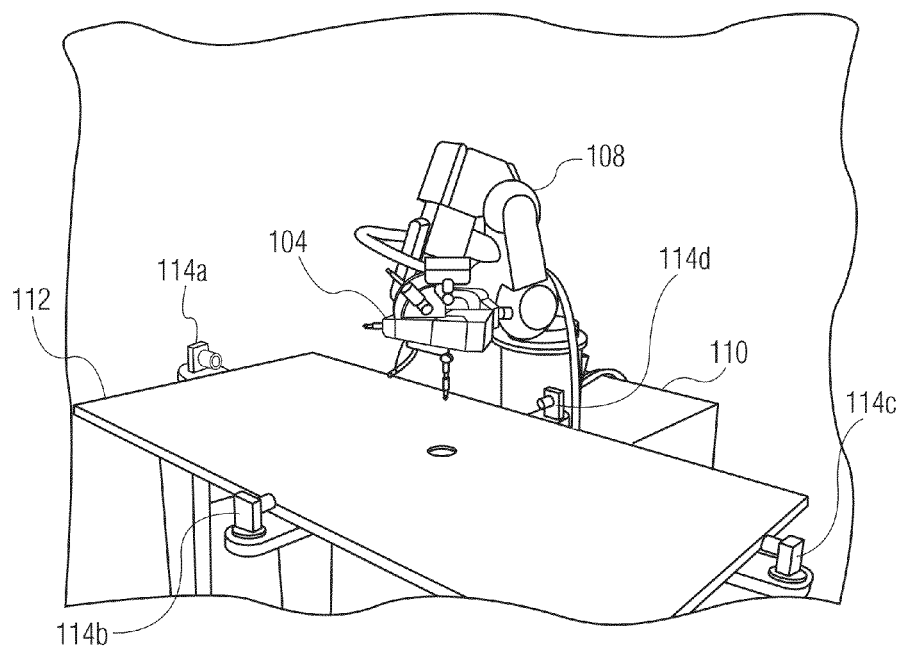
Figure 15J:
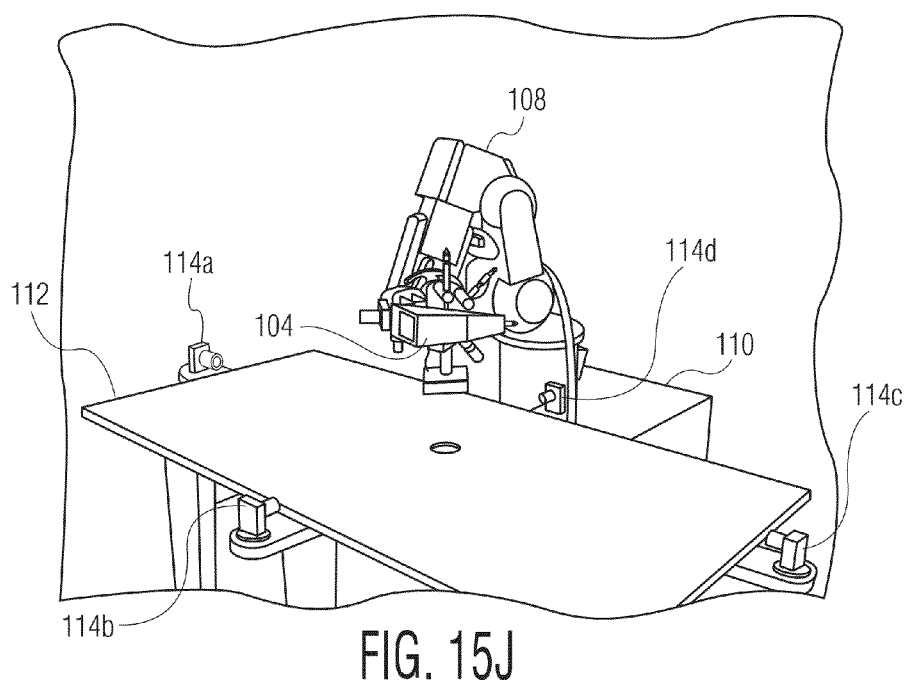

There are additional standard positions: a picture taking high position (e.g., for 3D space positions definition purposes) (shown in FIG. 15G), a low picture taking position, Z (e.g., for failure detection) (shown in FIG. 15H), one or more key press positions, which may include a first position to press a key on the keypad of the DUT 102 and a second position to touch a touchscreen of the DUT (one shown in FIG. 15I) and a brushing position (shown in FIG. 15J). The picture taking high position is used for moving the top camera 114E attached to the robotic arm 108 above the DUT for taking a picture that is used for 3D positions definition. The picture taking low position is used for moving the top camera above the DUT near its display for taking a picture for failure detection (e.g., only taking a picture of the display of the DUT so that only the display is visible in the picture). The key press positions are initial positions for key press operations, which may include physical keys and virtual keys displayed on the touchscreen of the DUT. These positions are the same positions as the north, south, east, west and top standard positions. The only difference is that, instead of the ESD gun 104 facing the DUT, the key press finger attached to the robotic arm faces the DUT. The brushing position is the initial position for brushing operation. This is the same position as the top standard position, but the only difference is that instead of the ESD Gun, the brush attached to the robotic arm faces the DUT.

The instruments calibration module 326 of the ESD testing software calibrates the instruments attached to the robotic arm 108. In an embodiment, the instruments assembly 106 attached to the robotic arm includes the ESD gun 104, the soft finger, the hard finger, the z height sensor and the brush. The robot controller of the robotic arm 108 knows only the position of its arms tip (which is the bottom of the instruments holder). Thus, the offset vector of each instrument's tip from the robot arm tip must be determined to know the tip of each instrument. The tip of the ESD gun is considered as the main point in 3D space of the coordinate system of the robotic arm. In other words, when coordinates from the robotic arm are received, the ESD testing software uses coordinates of the ESD gun tip. The gun tip coordinates are then used for the cameras and other instruments calibration. Thus, the most important step is to define the ESD gun tip offset vector from the reference point of the robotic arm.

Figure 17C:
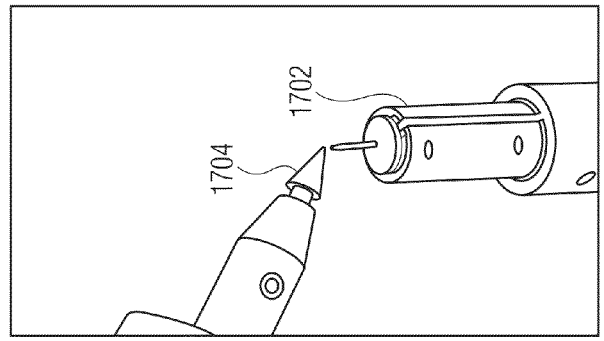
FIGS. 17A-17C illustrates the tip of an ESD gun attached to the robotic arm being moved to align with the tip of an object for gun tip calibration in accordance with an embodiment of the invention.
Figure 17B:
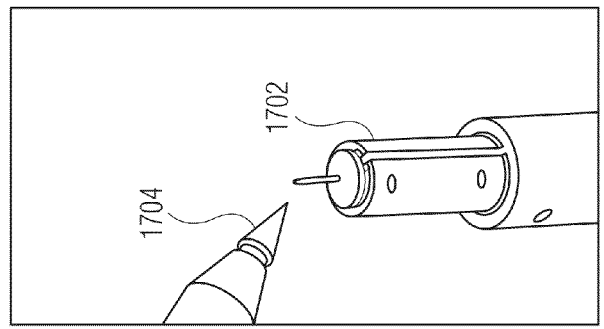
Figure 17A:
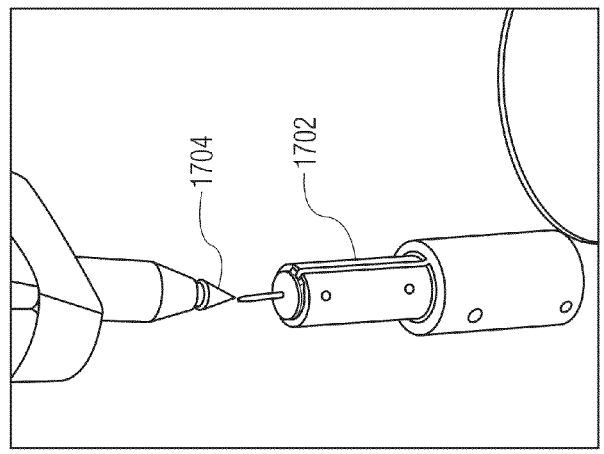

For gun tip calibration, as illustrated in FIG. 17A, an object 1702 with a sharp tip is placed on the ESD testing table 112. The robotic arm 108 approaches the tip of the object by the gun tip 1704 from top, north, east, south and west postures (i.e., from the standard positions). The user manually moves the robotic arm by, for example, a joystick and adjusts the gun tip with the target object tip very precisely for each posture. FIG. 17A illustrates an approach of the ESD gun tip from the top position, where the ESD gun tip is almost aligned with the target object tip. FIG. 17B illustrates an approach of the ESD gun tip from the west position, where the ESD gun tip needs to move further to the target object tip. FIG. 17C illustrates an approach of the ESD gun tip from the west position, where the ESD gun tip is almost aligned with the target object tip.

For each posture, the robotic arm reference point position is saved. After these actions, five positions of the robot arm reference point are acquired, but the position of the target object tip is unknown. However, the position of the target object tip is located on the same distance from the saved five positions of the robotic arm reference point.

In order to find the position of the target object tip, the position of the target object tip is approximately defined. Let's say its approximate coordinates are (xa, ya, za). Then, all points around this coordinates are searched in a cube with dimensions 20 mm×20 mm×20 mm by step 0.1 mm and consider that each point is considered real coordinates of the target object tip. For each point, vectors for the five postures are calculated, and the difference in their lengths is determined. This difference is the error for this particular position. After searching all points, the point with minimal error value is considered to be the real coordinate of the target object tip. Its corresponding average vector is saved as calibrated gun tip vector.

As soon as the gun tip vector is found, all other vectors for the different instruments can be easily found. The target object tip is approached with each instrument of the ESD testing system 100. The position of the target object tip is already known. Then, vector is taken as a difference between target coordinates and robotic arm reference point coordinates. This vector is then transformed according to robot arm posture to get the vector of the instrument offset.

All other vectors can be found easily once the gun tip vector is found because, before the gun tip is calibrated, the position of a target in the coordinate system of the robotic arm 108 cannot be found. As soon as the gun vector is known, any target can be placed on the ESD testing table 112, and approached by the gun tip to immediately get the coordinates of the target in the coordinate system of the robotic arm.

The failure detection module 318 of the ESD testing software detects display failures, acoustic failures and call drop failures. A display failure is detected by comparing two snapshots of the DUT display. One snapshot before ESD zapping and one after the zap. If two pictures are different, this indicates that display failure occurred. In an embodiment, the two images are compared by a histogram method. RGB histograms with sixteen bands are created for each image and the difference between them is calculated. If the difference is more than a threshold value, then images are considered to be different. The threshold value can be adjusted by the user. In normal conditions, 2% is optimal.

Acoustic failure detection is done by monitoring analog signal from the microphone 118. The user can define thresholds for the signal. Violation of the threshold condition by the signal is considered as an acoustic failure.

Figure 18:
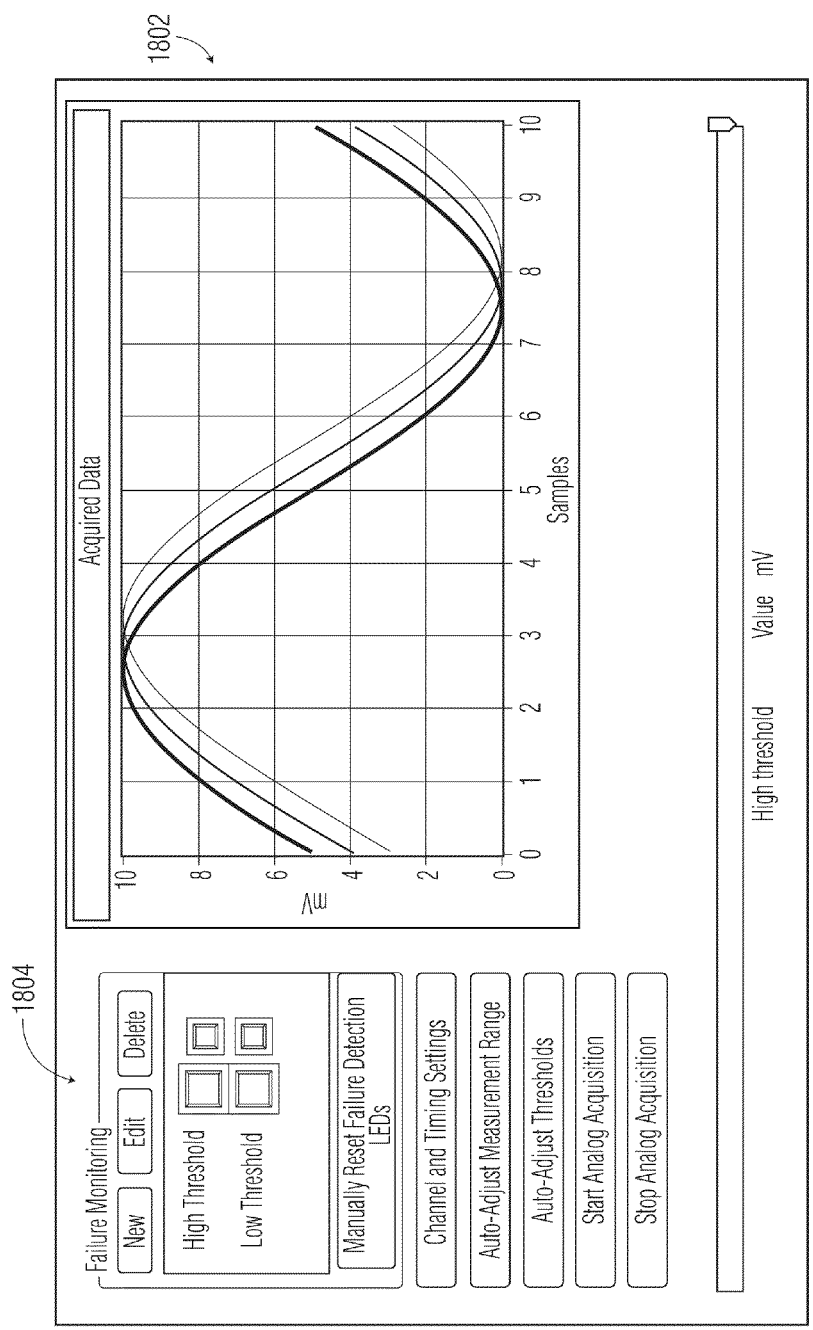
FIG. 18 is an example of one possible implementation of a special GUI provided by a failure detection module of the ESD testing software.

The failure detection module 318 provides a special GUI for analog signal monitoring. An example of one possible implementation of the special GUI provided by the failure detection module is shown in FIG. 18. The special GUI includes a signal plotter 1802. Real time signal from analog input and thresholds are plotted on the special GUI Failure is detected using thresholds. The user can create several thresholds. Each threshold has its own condition. These conditions are: "Signal constantly crosses threshold", "Signal is above threshold", and "Signal is below threshold." If threshold's corresponding condition is violated, this indicates that a failure occurred. The thresholds on the signal plotter may be presented by different color lines.

As shown in FIG. 18, failure monitoring controls 1804 are located on the left side of the special GUI. All defined thresholds appear in a list. In the list, threshold names and corresponding LEDs are presented. If a threshold condition is not violated, then the LED is green. If failure is detected, the LED becomes red and stays red while it is not reset by the user. Yellow LED flashes every time a threshold condition is violated.

Figure 19:
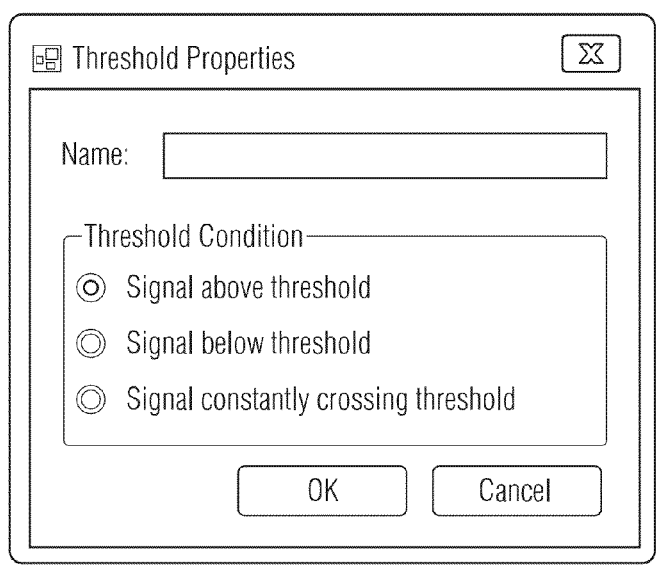
FIG. 19 illustrates a "new threshold" window associated with the special GUI shown in FIG. 18.

In order to create a new threshold, the user clicks the button "New". In this case, "New threshold" window appears, as illustrated in FIG. 19. After pressing the "OK" button, a new threshold is added in the list. The same window appears if the user selects a threshold in the list and presses the button "Edit" in the special GUI (shown in FIG. 18). Selected threshold is removed by pressing the button "Delete."

Figure 20:
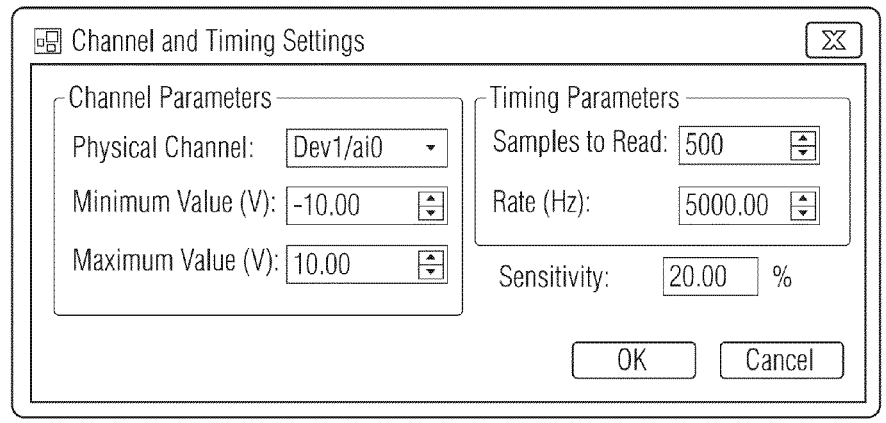
FIG. 20 illustrates a "Channel and Timing Settings" window associated with the special GUI shown in FIG. 18.

In the special GUI, as shown in FIG. 18, if the user presses the button "Manually Reset Failure Detection LED," then red LEDs are reset to green until new failure occurs. Signal monitoring parameters can be set by clicking the button "Channel and Timing Settings," which makes a window to appear, as illustrated in FIG. 20. The default setting for physical channel is Dev1/ai0. Other channels can be selected using combo box. "Minimum Value (V)" and "Maximum Value (V)" limit the range of the measured signal. The user should make sure that the analog signal fits in these limits. "Rate (Hz)" determines how fast the DAQ is sampling in Hz. Values higher than 10 kHz are not recommended because those values do not improve the acquired signal's quality and overload the DAQ board. "Samples to Read" determines how many samples to output to "Acquired Data" graph. If the number of "Samples to Read" is numerically equal to "Rate" in Hz, the "Acquired Data" graph will show signal duration of 1 sec. "Sensitivity" determines how close/far the thresholds will be placed using Auto-Adjust method. First, the maximum and minimum levels of the signal are found. Then the difference is calculated. If the sensitivity is set to 100%, then the thresholds are placed within the difference away from the signal's min and max levels. If the sensitivity is set to 50%, then the thresholds are placed within the difference/2 away from the signal's min and max levels closer to the signal. The higher is %, the lower is the sensitivity.

Turning back to FIG. 18, if the user presses the button "Auto-Adjust Measurement Range," the failure detection module 318 enters the measurement range auto adjustment mode. This mode stays on, until the button is pressed again. In this mode, minimum threshold is moved to the signal minimal value and maximum threshold is moved to the maximum value of the signal and stay there.

If the user presses the button "Auto-Adjust Thresholds," the failure detection module 318 enters the thresholds auto adjustment mode. This button stays pressed until the mode is exited. In this mode, minimum and maximum thresholds are automatically offset from minimum and maximum values of the signal by sensitivity value that was defined in the settings window.

If the user presses the button "Start Analog Acquisition," the failure detection module 318 starts working in the failure detection mode. After pressing this button, if threshold's condition is violated, failure is detected and corresponding LED becomes red. The failure detection mode can be exited by pressing the button "Stop Analog Acquisition."

The slider at the bottom of the GUI can be moved to adjust the selected threshold manually, i.e., increase or decrease the value of the selected threshold.

Call drop failure is detected by the failure detection module 318 by communication with the call box 120.

Figure 21:
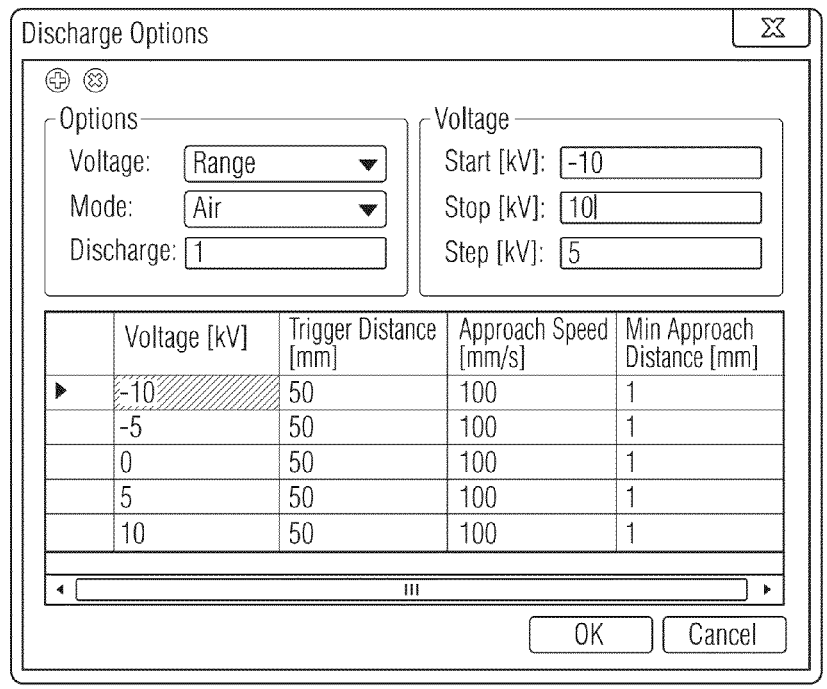
FIG. 21 is an example of one possible implementation of a special GUI provided by an ESD gun control module of the ESD testing software.

The ESD gun control module 322 of the ESD testing software controls the ESD gun 104, such as voltage settings and ESD discharges, during a testing process. The ESD gun control module provides a special GUI for setting ESD gun parameters. An example of one possible implementation of a special GUI for setting ESD gun parameters provided by the ESD gun control module is shown in FIG. 21. Using the GUI, a user can define discharge method, voltages, gun approaching parameters and repetition rate.

Figure 22:
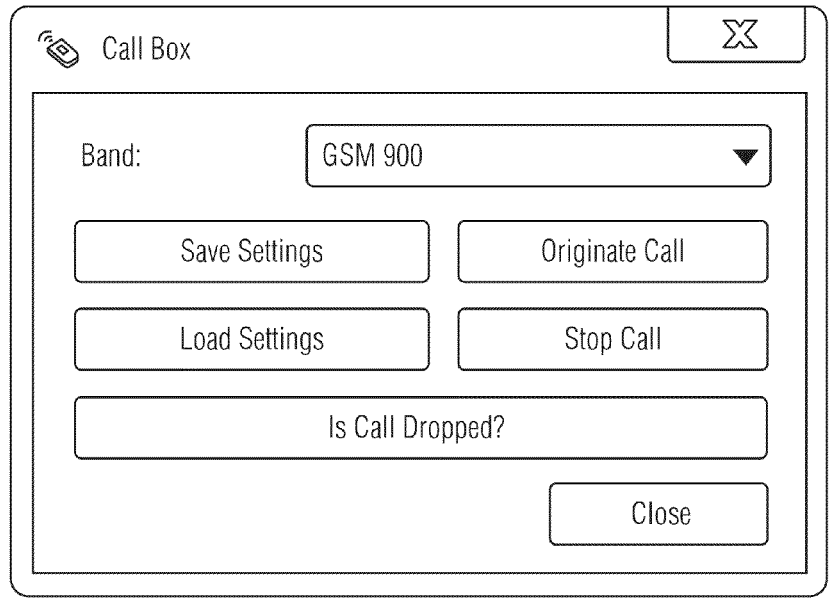
FIG. 22 is an example of one possible implementation of a special GUI provided by a call box control module of the ESD testing software.

The call box control module 320 of the ESD testing software controls the call box 120. The ESD testing software can initiate a call, check whether a call is dropped or not, and save and load settings for different bands using the call box control module. The call box control module provides a special GUI for controlling the call box. An example of one possible implementation of a special GUI for controlling the call box is illustrated in FIG. 22.

The report generation module 330 of the ESD testing software is responsible for report generation in a word processing format, such as Word format, and/or a spreadsheet format, such as Excel format. "Word" and "Excel" are trademarks or registered trademarks of Microsoft Corporation. All data collected during a test process is exported into documents. This data may include screenshots, user comments, failure description, gun settings, etc. The resulting documents may include hyperlinks so that a user can easily navigate between images and tables using the hyperlinks.

The sound recognition module 316 of the ESD testing software operates to recognize sound. For sound recognition, there are two analog signals: one reference and one recorded during a test process. The sound recognition module compares these two analog signals. If occurrence of the reference signal can be found in the recorded signal, this indicates that sound is recognized. The sound recognition module follows the following algorithm. First, both signals are divided into segments of ⅙ seconds. For each segment, fast Fourier transform (FFT) is calculated. Having function of comparison of specters for each segment, occurrence of one signal in another is searched like substring in string.

The automatic DUT position adjustment module 314 of the ESD testing software operates to recognize images and uses the images to adjust the position of the DUT 102 accordingly. If the DUT is moved after test points definition, all defined points need to be adjusted to its new location. The ESD testing software has the old picture of the DUT (picture that was used during points definition) and a new picture (in which the DUT has a new position). Based on these pictures, the DUT is recognized and all points are adjusted automatically to its new location. The automatic DUT position adjustment module follows the following algorithm. First, on both pictures, contour segments are marked that are at the most contrast areas of the picture. From all possible combinations, two such segments are searched, that if the segments match, the correspondence is the highest. As soon as the segments cannot fit each other exactly, "floating segments" method is used to achieve the correspondence (the end points of the segments are moved pixel by pixel towards the increment of correspondence). With help of these two segments (also having the distance from the camera to the DUT), all test points are transformed to new position.

Figure 23:
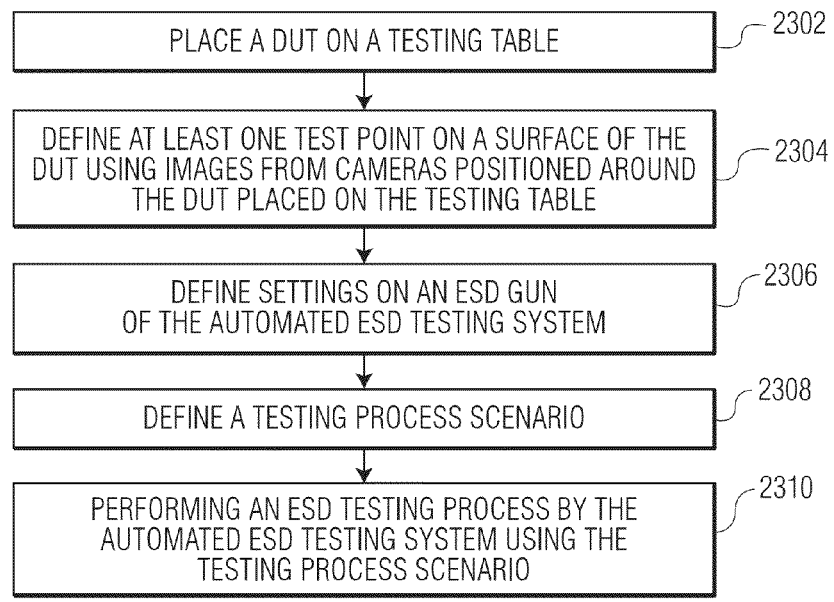
FIG. 23 is a flow diagram of a method for ESD testing a device under test (DUT) using an automated ESD testing system in accordance with an embodiment of the invention.

A method for ESD testing a DUT using an automated ESD testing system in accordance with an embodiment of the invention is described with reference to a flow diagram of FIG. 23. At block 2302, the DUT is placed on a testing table. Next, at block 2304, at least one test point on a surface of the DUT is defined using images from cameras positioned around the DUT placed on the testing table. Next, at block 2306, settings on an ESD gun of the automated ESD testing system are defined. Next, at block 2308, a testing process scenario is defined. The testing process scenario includes actions to be executed by the automated ESD testing system during an ESD testing process. Next, at block 2310, the ESD testing process is performed by the automated ESD testing system using the testing process scenario, wherein the ESD testing process includes moving the ESD gun to the test point using a robotic arm of the automated ESD testing system and activating the ESD gun at the test point.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. As an example, in other implementations, the testing system 100 may be used for testing DUTs for other types of EM disturbances, such as electric and magnetic field disturbances using an appropriate EM source. The scope of the invention is to be defined by the claims appended hereto and their equivalents.

What is claimed is:

1. A system for electrostatic discharge (ESD) testing a device under test (DUT), the system comprising:
    a testing table to accommodate the DUT;
    a robotic arm operably coupled to the testing table;
    a plurality of cameras positioned around the testing table;
    an ESD gun attached to the robotic arm, the ESD gun being configured to provide ESD when activated; and
    a control computer coupled to the robotic arm, the cameras and the ESD gun, the control computer being configured to control the robotic arm, the cameras and the ESD gun, the control computer being further configured to allow a user to define at least one test point on a surface of the DUT using images from the cameras, settings on the ESD gun and a testing process scenario that includes actions to be executed by the system during an ESD testing process, the control computer being further configured to control at least the robotic arm and the ESD gun to perform the ESD testing process using the testing process scenario, wherein the ESD testing process includes moving the ESD gun to the at least one test point using the robotic arm and activating the ESD gun at the at least one test point.

2. The system of claim 1, further comprising a data acquisition module coupled to the control computer, the data acquisition module being configured to process audio signal from the DUT to detect audio failure of the DUT due to the ESD provided by the ESD gun.

3. The system of claim 1, wherein one of the cameras is attached to the robotic arm to capture images of a display of the DUT to detect display failure of the DUT due to the ESD provided by the ESD gun.

4. The system of claim 1, further comprising a call box operably coupled to the control computer, the call box being configured to original a cell phone call to the DUT and to detect when the cell phone call with the DUT is dropped during the ESD testing process.

5. The system of claim 1, further comprising at least one instrument attached to the robotic arm, the at least one instrument being used to interface with the DUT during the ESD testing process.

6. The system of claim 1, wherein the control computer is configured to always move the robotic arm to an initial standard position when the robotic arm is being moved from any first location to any second location, the initial standard position being a position of the robotic arm from and to which the robotic arm can be moved without contacting the DUT.

7. The system of claim 1, wherein the control computer is configured to determine any point on any surface of the DUT using first and second images from two of the cameras pointing perpendicular to each other, the first image being used to define a plane level, the second image being used to define two coordinates on a plane corresponding to the plane level.

8. The system of claim 1, wherein the control computer is configured to adjust any defined points when the DUT has been moved using images of the DUT captured by at least one of the cameras before and after the DUT has been moved.

9. A method for electrostatic discharge (ESD) testing a device under test (DUT) using an automated ESD testing system, the method comprising:
    placing the DUT on a testing table;
    defining at least one test point on a surface of the DUT using images from cameras positioned around the DUT placed on the testing table;
    defining settings on an ESD gun of the automated ESD testing system;
    defining a testing process scenario that includes actions to be executed by the automated ESD testing system during an ESD testing process; and
    performing the ESD testing process by the automated ESD testing system using the testing process scenario, wherein the ESD testing process includes moving the ESD gun to the at least one test point using a robotic arm of the automated ESD testing system and activating the ESD gun at the at least one test point.

10. The method of claim 9, wherein the performing the ESD testing process includes processing audio signal from the DUT to detect audio failure of the DUT due to the ESD provided by the ESD gun.

11. The method of claim 9, wherein the performing the ESD testing process includes comparing images of a display of the DUT captured by a camera attached to the robotic arm to detect display failure of the DUT due to the ESD provided by the ESD gun.

12. The method of claim 9, wherein the performing the ESD testing process includes detecting when a cell phone call with the DUT is dropped during the ESD testing process.

13. The method of claim 9, wherein the performing the ESD testing process includes interfacing with the DUT using at least one instrument attached to the robotic arm during the ESD testing process.

14. The method of claim 9, wherein the performing the ESD testing process includes always moving the robotic arm to an initial standard position when the robotic arm is being moved from any first location to any second location, the initial standard position being a position of the robotic arm from and to which the robotic arm can be moved without contacting the DUT.

15. The method of claim 9, further comprising determining any point on any surface of the DUT using first and second images from two of the cameras pointing perpendicular to each other, the first image being used to define a plane level, the second image being used to define two coordinates on a plane corresponding to the plane level.

16. The method of claim 9, further comprising adjusting any defined points on any surface of the DUT when the DUT has been moved using images of the DUT captured by at least one of the cameras before and after the DUT has been moved.

17. A computer-readable storage medium containing program instructions for electrostatic discharge (ESD) testing a device under test (DUT) using an automated ESD testing system, wherein execution of the program instructions by one or more processors of a computer system causes the one or more processors to perform steps comprising:

defining at least one test point on a surface of the DUT using images from cameras positioned around the DUT placed on a testing table;

defining settings on an ESD gun of the automated ESD testing system;

defining a testing process scenario that includes actions to be executed by the automated ESD testing system during an ESD testing process; and controlling the automated ESD testing system to perform the ESD testing process using the testing process scenario, wherein the ESD testing process includes moving the ESD gun to the at least one test point using a robotic arm of the automated ESD testing system and activating the ESD gun at the at least one test point.

18. The computer-readable storage medium of claim 17, wherein the controlling the automated ESD testing system includes always moving the robotic arm to an initial standard position when the robotic arm is being moved from any first location to any second location, the initial standard position being a position of the robotic arm from and to which the robotic arm can be moved without contacting the DUT.

19. The computer-readable storage medium of claim 17, wherein the steps further comprises determining any point on any surface of the DUT using first and second images from two of the cameras pointing perpendicular to each other, the first image being used to define a plane level, the second image being used to define two coordinates on a plane corresponding to the plane level.

20. The computer-readable storage medium of claim 17, wherein the steps further comprises adjusting any defined points on any surface of the DUT when the DUT has been moved using images of the DUT captured by at least one of the cameras before and after the DUT has been moved.

* * * * *